(12) United States Patent
Lyu et al.

(10) Patent No.: US 11,522,338 B2
(45) Date of Patent: Dec. 6, 2022

(54) SYSTEM AND METHOD FOR CONTROLLING LASER PROJECTOR, LASER PROJECTOR ASSEMBLY AND TERMINAL

(71) Applicant: GUANGDONG OPPO MOBILE TELECOMMUNICATIONS CORP., LTD., Guangdong (CN)

(72) Inventors: Xiangnan Lyu, Guangdong (CN); Jian Bai, Guangdong (CN); Biao Chen, Guangdong (CN); Ziqing Guo, Guangdong (CN); Guohui Tan, Guangdong (CN); Haitao Zhou, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 485 days.

(21) Appl. No.: 16/688,462

(22) Filed: Nov. 19, 2019

(65) Prior Publication Data

US 2020/0091680 A1    Mar. 19, 2020

Related U.S. Application Data

(63) Continuation of application No. PCT/CN2019/076075, filed on Feb. 25, 2019.

(30) Foreign Application Priority Data

Apr. 28, 2018 (CN) .......................... 201810404507.1
May 30, 2018 (CN) .......................... 201810541431.7

(51) Int. Cl.
*G06F 1/04*     (2006.01)
*G06F 1/16*     (2006.01)
(Continued)

(52) U.S. Cl.
CPC ............ *H01S 5/0428* (2013.01); *G01B 11/25* (2013.01); *G06F 1/04* (2013.01); *G06F 1/1686* (2013.01); *G06V 40/16* (2022.01); *G01B 11/303* (2013.01)

(58) Field of Classification Search
CPC ..... H01S 5/0428; G01B 11/25; G01B 11/303; G06F 1/04; G06F 1/1686; G06V 40/16
See application file for complete search history.

(56) References Cited

U.S. PATENT DOCUMENTS 9,620,080 B2 *   4/2017   Reddy ................... E04H 4/148
2001/0014068 A1  8/2001   Chu et al.
(Continued)

FOREIGN PATENT DOCUMENTS

CN        1938916 A        3/2007
CN      101409589 A        4/2009
(Continued)

OTHER PUBLICATIONS

English translation of Introduction to Pattern Recognition Technology Face Recognition and Speech Recognition; pp. 68-71.
(Continued)

*Primary Examiner* — John W Poos
(74) *Attorney, Agent, or Firm* — Young Basile Hanlon & MacFarlane, P.C.

(57) ABSTRACT

Disclosed in embodiments of the present disclosure is a system for controlling a laser projector, a laser projector assembly, a terminal, a method for controlling a laser projector, a method for controlling a laser light output, a device for controlling a laser light output and a computer readable storage medium. The system includes a first drive circuit coupled to the laser projector. The first drive circuit is configured to output an electrical signal to drive the laser projector to project laser light and to turn off the laser
(Continued)

projector when a duration of outputting the electrical signal is greater than or equal to a preset threshold.

15 Claims, 13 Drawing Sheets

(51) Int. Cl.
*H01S 5/042* (2006.01)
*G01B 11/25* (2006.01)
*G06V 40/16* (2022.01)
*G01B 11/30* (2006.01)

(56) References Cited

U.S. PATENT DOCUMENTS

| | | | |
|---|---|---|---|
| 2005/0213622 | A1 | 9/2005 | Diaz |
| 2017/0063027 | A1* | 3/2017 | Saha .................. G01R 17/02 |
| 2017/0285078 | A1* | 10/2017 | Saha .................. H01S 5/06825 |
| 2019/0369473 | A1* | 12/2019 | Lyu .................. G06F 21/32 |
| 2019/0369474 | A1* | 12/2019 | Lyu .................. G03B 21/2033 |

FOREIGN PATENT DOCUMENTS

| | | |
|---|---|---|
| CN | 101916959 A | 12/2010 |
| CN | 203366017 U | 12/2013 |
| CN | 103825185 A | 5/2014 |
| CN | 104505702 A | 4/2015 |
| CN | 105373223 A | 3/2016 |
| CN | 105425661 A | 3/2016 |
| CN | 106572340 A | 4/2017 |
| CN | 107105217 A | 8/2017 |
| CN | 107122032 A | 9/2017 |
| CN | 107424187 A | 12/2017 |
| CN | 108767654 A | 11/2018 |
| CN | 108805025 A | 11/2018 |
| DE | 102017207957 A1 | 11/2017 |
| JP | S61290786 A | 12/1986 |

OTHER PUBLICATIONS

English translation of Intelligent customer service robot dated Sep. 2017.
English translation of Research on Mobile Payment Based on TEE Technology; pp. 52-53.
English translation of Decision of Rejection 201810541431.7 dated Feb. 28, 2020.
Search report for EP application 19793203.1 dated Jun. 16, 2020.
India Office Action for IN Application 201917045808 dated Jan. 29, 2021. (5 pages).
Office Action with English translation issued for CN application 201810404507.1, dated Mar. 25, 2019.
Office Action with English translation issued for CN application 201810541431.7, dated Feb. 28, 2019.
Office Action with English translation issued for CN application 201810541431.7, dated Jun. 17, 2019.
International search report with English translation issued for PCT application PCT/CN2019/076075, dated May 13, 2019.

* cited by examiner

SYSTEM AND METHOD FOR CONTROLLING LASER PROJECTOR, LASER PROJECTOR ASSEMBLY AND TERMINAL

CROSS-REFERENCE TO RELATED APPLICATION(S)

This application is a continuation of International Application No. PCT/CN2019/076075, filed on Feb. 25, 2019, which claims priority to Chinese Patent Application No. 201810541431.7, filed on May 30, 2018, and Chinese Patent Application No. 201810404507.1, filed on Apr. 28, 2018, the entire contents of all of which are incorporated herein by reference in their entireties.

TECHNICAL FIELD

The present disclosure relates to a field of consumer electronics technologies, and more particular to, a system for controlling a laser projector, a laser projector assembly, a terminal, a method for controlling a laser projector, a method for controlling a laser light output, a device for controlling a laser light output and a computer readable storage medium.

BACKGROUND

With the development of face recognition technology, more and more terminal devices may perform functions of unlocking, payment through face recognition. In a process of face recognition, the terminal device usually projects laser light to a target object via a laser projector. A laser pattern after modulation by the target object is collected by an infrared camera to form a depth image for the face recognition.

SUMMARY

Implementations of the present disclosure provide a system for controlling a laser projector, a laser projector assembly, a method for controlling a laser projector, a method for controlling a laser light output, a device for controlling a laser light output and a computer readable storage medium.

The system for controlling a laser projector according to implementations of the present disclosure includes a first drive circuit coupled to the laser projector. The first drive circuit is configured to output an electrical signal to drive the laser projector to project laser light, and to turn off the laser projector when a duration of outputting the electrical signal is greater than or equal to a preset threshold.

The laser projector assembly according to implementations of the present disclosure includes a laser projector and the above system. The laser projector is coupled to the first drive circuit.

The terminal according to implementations of the present disclosure includes a laser projector and the above system. The laser projector is coupled to the first drive circuit.

The method for controlling a laser projector according to implementations of the present disclosure is applied to control the laser projector. The laser projector is coupled to the first drive circuit, and the method includes: outputting, by the first drive circuit, an electrical signal to drive the laser projector to project laser light; and turning off the laser projector when a duration of outputting the electrical signal is greater than or equal to a preset threshold.

The method for controlling a laser light output according to implementations of the present disclosure includes: recording a first time point for turning on a laser module in response to detecting that the laser module is turned on; obtaining a time interval from the first time point to a current operating time point of the laser module; and controlling a laser light output of the laser module in response to that the time interval satisfies a preset time period.

The device for controlling a laser light output according to implementations of the present disclosure includes a first time point recording module, a time interval obtaining module, and a laser light output control module. The first time point recording module is configured to record a first time point for turning on a laser module in response to detecting that the laser module is turned on. The time interval obtaining module is configured to obtain a time interval from the first time point to a current operating time point of the laser module. The laser light output control module is configured to control a laser light output of the laser module when the time interval satisfies a preset time period.

The terminal according to implementations of the present disclosure includes a memory and a processor. The memory has a computer program stored therein, and when the computer program is executed by the processor, the processor is configured to implement the above method for controlling laser light output.

The computer readable storage medium according to implementations of the present disclosure has a computer program stored therein. When the computer program is executed by a processor, the above method for controlling laser light output is implemented.

Additional aspects and advantages of the present disclosure will be given in the following description, some of which will become apparent from the following description or be learned from practices of the present disclosure.

BRIEF DESCRIPTION OF DRAWINGS

The above and/or additional aspects and advantages of the present disclosure will become apparent and easy to be understood from descriptions of implementations with reference to following drawings, in which.

DETAILED DESCRIPTION

Figure 1:
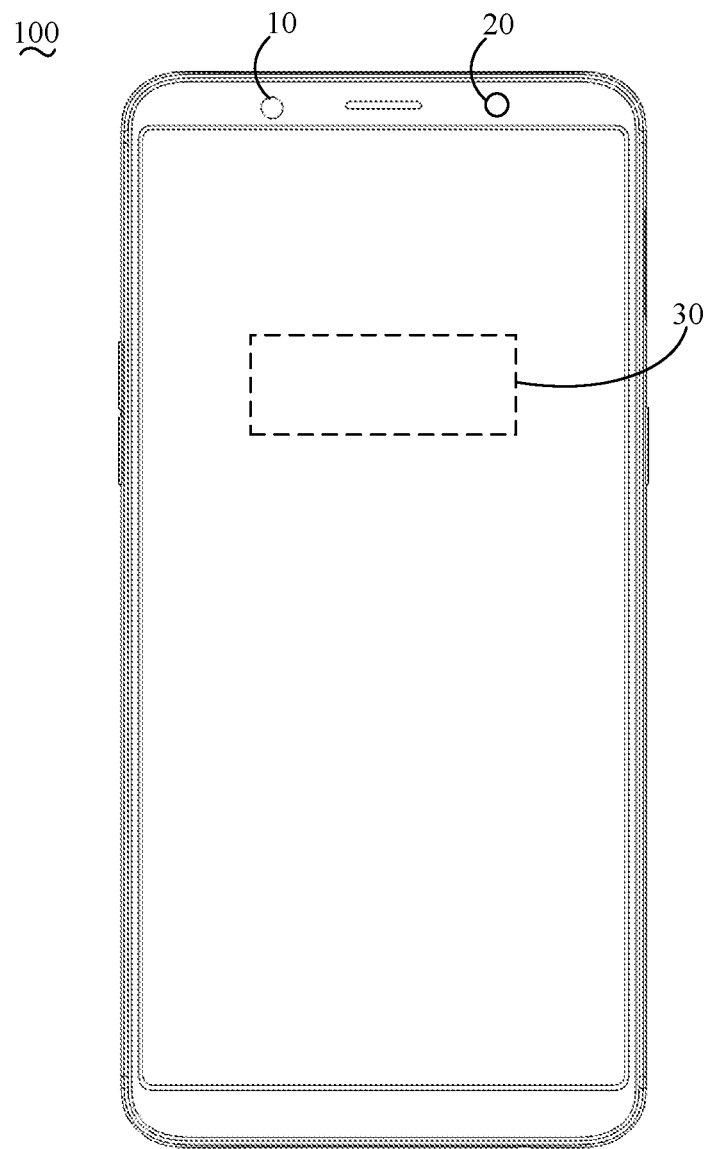
FIG. 1 is a schematic diagram illustrating a terminal according to some implementations of the present disclosure.

Implementations of the present disclosure will be described with reference to accompanying drawings. The same or similar reference numerals in the drawings denote the same or similar elements or elements having the same or similar functions. In addition, the implementations of the present disclosure described below with reference to the accompanying drawings are merely illustrative of the implementations of the present disclosure, and are not to be construed as limitation of the present disclosure.

In the present disclosure, a first feature "on" or "below" a second feature may be that the first feature directly contacts the second feature, or the first feature indirectly contact the second feature through an intermediate medium, unless otherwise explicitly stated and defined. Moreover, the first feature "above", "on" and "over" the second feature may be that the first feature is right above the second feature or the first feature is obliquely above the second feature, or merely that the first feature is higher than the second feature. The first feature "beneath", "below" and "under" the second feature may be that the first feature is right below the second feature, or the first feature is obliquely below the second feature, or merely that the first feature is lower than the second feature.

Figure 2:
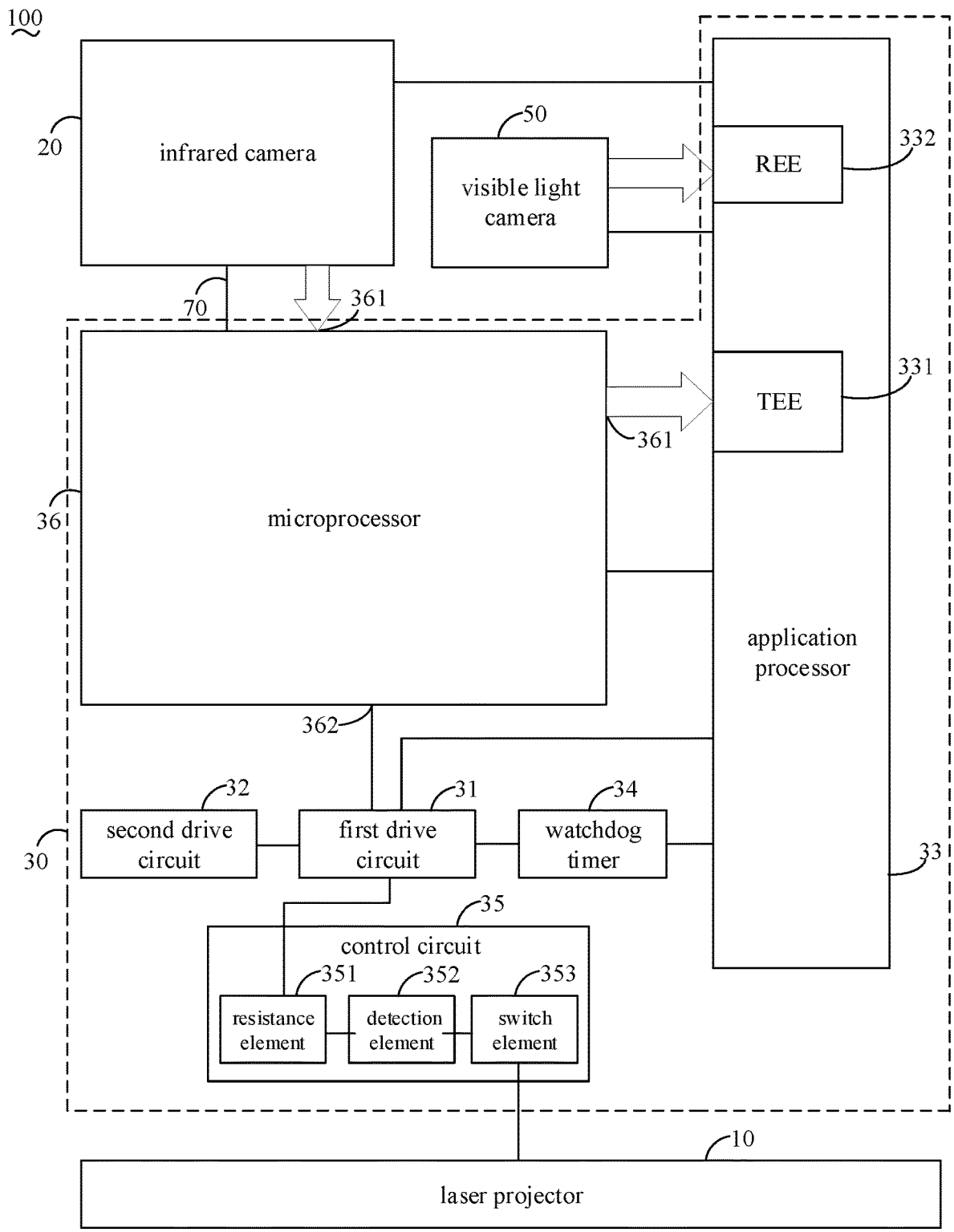
FIG. 2 is a block diagram illustrating a terminal according to some implementations of the present disclosure.

As illustrated in FIGS. 1 and 2, the terminal 100 according to the implementations of the present disclosure includes a laser projector 10, an infrared camera 20 and a control system 30. The terminal 100 may be a phone, a tablet computer, a smart watch, a smart bracelet, a smart wearable device, or the like. In embodiments of the present disclosure, the terminal 100 as a phone may be taken as an example for description. It may be understood that, the terminal 100 is not limited to the phone.

The laser projector 10 is capable of projecting laser light to a target object. The laser light may be infrared light. The laser light projected by the laser projector 10 may carry a certain pattern, such as speckles and stripes. The infrared camera 20 is capable of capturing an infrared image of the target object, or receiving the laser pattern after modulation by the target object. In order to obtain a clear laser pattern, multiple frames of laser light are continuously emitted to the target object at a certain light power. However, if the laser projector 10 continuously emits the laser light, the laser light may burn the user, particularly eyes of the user. Therefore, it is necessary to avoid that the laser projector 10 continuously emits the laser light.

The control system 30 includes a first drive circuit 31, a second drive circuit 32, an application processor 33, a watchdog timer 34 and a microprocessor 36.

The first drive circuit 31 is coupled to the laser projector 10. The first drive circuit 31 may configured to output an electrical signal to drive the laser projector 10 to project laser light. In particularly, the first drive circuit 31 acts as a current source of the laser projector 10. When the first drive circuit 31 is turned off, the laser projector 10 may be unable to emit the laser light. The second drive circuit 31 is coupled to the first drive circuit 31. The second drive circuit 32 may be configured to supply power for the first drive circuit 31. For example, the first drive circuit 31 may be a DC (direct current)/DC circuit. The first drive circuit 31 may be separately packaged as a driver chip. The second drive circuit 32 may also be separately packaged as a driver chip. Also, the first drive circuit 31 and the second drive circuit 32 may be packaged into a single driver chip. The driver chip may be arranged on a substrate or a circuit board of the laser projector 10.

Figure 3A:
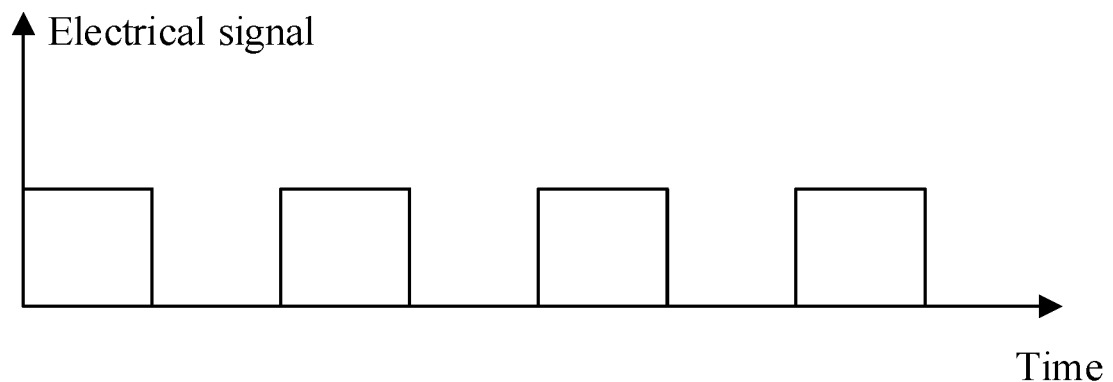
FIG. 3A is a schematic diagram illustrating a pulse signal outputted by a first drive circuit according to some implementations of the present disclosure.
Figure 3B:
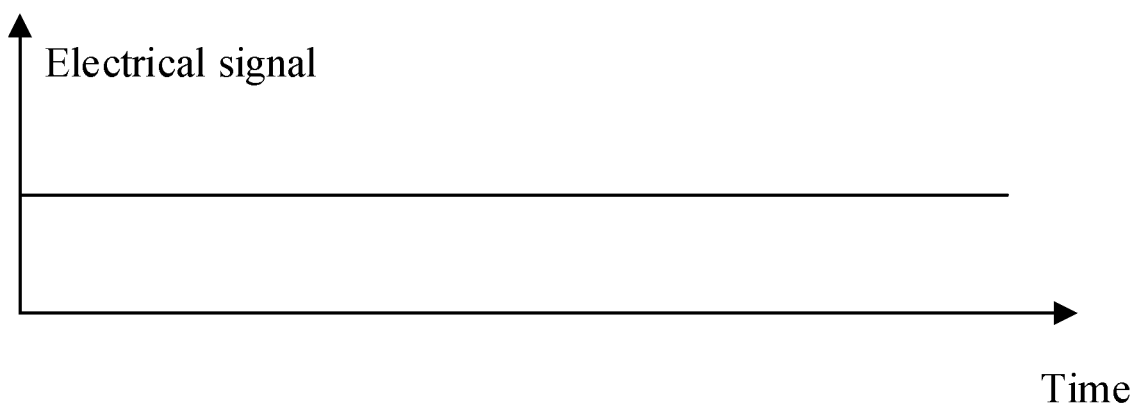
FIG. 3B is a schematic diagram illustrating a pulse signal outputted by a first drive circuit according to some implementations of the present disclosure.

As illustrated in FIG. 3A, when the first drive circuit 31 is operating normally, the first drive circuit 31 outputs a pulse signal (such as a square signal), such that the laser projector 10 may continuously emit multiple frames of laser light. As illustrated in FIG. 3B, when a fault occurs in the first drive circuit 31, the first drive circuit 31 may keep outputting a high-level signal, such that the laser projector 10 may continuously emit the laser light. In order to prevent that the laser light continuously outputted by the laser projector 10 burns the user, in embodiments of the present disclosure, the laser projector 10 may be turned off by the first drive circuit 31.

In detail, the first drive circuit 31 may be integrated with a timing function, and the first drive circuit 31 may detect whether a duration of outputting the electrical signal is greater than or equal to a preset threshold. When the duration of outputting the electrical signal is greater than or equal to the preset threshold, the first drive circuit 31 stops outputting the electrical signal to turn off the laser projector 10. The preset threshold may be [3, 10] milliseconds. For example, the preset threshold may be set to 3 milliseconds, 4 milliseconds, 5 milliseconds, 6 milliseconds, 7 milliseconds, 8 milliseconds, 9 milliseconds, 10 milliseconds, or any value within the above range.

Referring to FIG. 2 again, the application processor 33 may be used as a system of the terminal 100. The application processor 33 may be coupled to the first drive circuit 31. The application processor 33 may also be coupled to the infrared camera 20. The application processor 33 may also be coupled to a visible light camera 50. The application processor 33 may also be coupled to a plurality of electronic components of the terminal 100 and control the plurality of electronic components to operate in a predetermined mode, for example, control the display screen of the terminal 100 to display a predetermined screen, control the antenna of the terminal 100 to transmit or receive predetermined data, control the visible light camera 50 of the terminal 100 to acquire a color image and process the color image, control powering on and off of the infrared camera 20, turn off or reset the infrared camera 20, or the like.

The application processor 33 may be further configured to control the first drive circuit 31 to operate to drive the laser projector 10 to project laser light. In detail, the application processor 33 transmits a predetermined signal to the watchdog timer 34 at predetermined time intervals to control the first drive circuit 31 to operate via the watchdog timer 34. For example, the application processor 33 transmits the predetermined signal to the watchdog timer 34 every 50 milliseconds. The watchdog timer 34 receives the predetermined signal transmitted by the application processor 33. In embodiments of the present disclosure, in order to prevent that the laser light continuously outputted by the laser projector 10 burns the user, the watchdog timer 34 may be controlled by the application processor 33 to switch off the first drive circuit 31 to further turn off the laser projector 10.

In detail, when the laser projector 10 continuously emits laser light, in other words, when the duration of outputting the electrical signal by the first drive circuit 31 is greater than or equal to the preset threshold, the first drive circuit 31 transmits a timeout signal to the application processor 33. When the application processor 33 receives the timeout signal transmitted by the first drive circuit 31, the application processor 33 stops transmitting the predetermined signal to the watchdog timer 34. The watchdog timer 34 is coupled to the first drive circuit 31, and the watchdog timer 34 is coupled to the application processor 33. The watchdog timer 34 is configured to switch off the first drive circuit 31 to turn off the laser projector 10 when the predetermined signal is not received within a preset time period. The preset time period may be set before the terminal 100 leaves factory, or may be customized by the user on the terminal 100.

In embodiments of the present disclosure, the watchdog timer 34 may be a counter. After the watchdog timer 34 receives the predetermined signal, the watchdog timer 34 starts counting down from a certain number at a certain speed. If the first drive circuit 31 normally outputs the pulse signal, the application processor 33 retransmits the predetermined signal before the countdown reaches 0, and the watchdog timer 34 resets the countdown after receiving the predetermined signal. If the duration of outputting the electrical signal by the first drive circuit 31 is greater than or equal to the preset threshold, and the application processor 33 does not transmit the predetermined signal when the watchdog timer 34 counts to 0, the watchdog timer 34 is deemed to determine that the first drive circuit 31 is malfunctioning, in this case, the watchdog timer 34 transmit a signal to switch off the first drive circuit 31 to further turn off the laser projector 10.

In an example, the watchdog timer 34 may be disposed external to the application processor 33, and the watchdog timer 34 may be an external timer chip, and the watchdog timer 34 may be coupled to an I/O pin of the application processor 33 to receive the predetermined signal transmitted by the application processor 33. The reliability of the external watchdog timer 34 is high. In another example, the watchdog timer 34 may be integrated into the application processor 33, and the functionality of the watchdog timer 34 may be implemented by the internal timer of the application processor 33, which simplifies the hardware circuit design of the control system 30.

In some implementations, the watchdog timer 34 is further configured to send a reset signal for restarting the application processor 33 when the predetermined signal is not received within the preset time period. As described above, when the watchdog timer 34 does not receive the predetermined signal within the preset time period, malfunction of the application processor 33 has occurred, and in this case, the watchdog timer 34 sends the reset signal to cause the application processor 33 to reset and operate normally.

In detail, in an example, the reset signal may be directly received by the application processor 33. The reset signal has a higher level in the execution program of the application processor 33, and the application processor 33 may preferentially respond to the reset signal for resetting. In another example, the reset signal may be sent to a reset chip external to the application processor 33, and the reset chip forces the application processor 33 to reset in response to the reset signal.

In some implementations, the preset time period is [50, 150] milliseconds. In detail, the preset time period may be set to 50 milliseconds, 62 milliseconds, 75 milliseconds, 97 milliseconds, 125 milliseconds, 150 milliseconds, or any value within the above range. It can be understood that if the preset time period is set too short, the application processor 33 is required to transmit the predetermined signal too frequently, which may occupy too much processing space of the application processor 33 and cause the terminal 100 to be easily jammed. If the preset time period is set too long, the failure of the first drive circuit 31 cannot be detected in time, in other words, the laser projector 10 cannot be turned off in time, which is disadvantageous for the safe use of the laser projector 10. By setting the preset time period within [50, 150] milliseconds, it is possible to better balance the fluency and security of the terminal 100.

The microprocessor 36 may be a processing chip, and the microprocessor 36 is coupled to the application processor 33, the first drive circuit 31, and the infrared camera 20 respectively.

The microprocessor 36 is coupled to the application processor 33 to enable the application processor 33 to reset the microprocessor 36, wake the microprocessor 36, and debug the microprocessor 36. The microprocessor 36 may be coupled to the application processor 33 via a Mobile Industry Processor Interface (MIPI) 361. In detail, the microprocessor 36 is coupled to the trusted execution environment (TEE) 331 of the application processor 33 via the MIPI 361, to directly transmit the data in the microprocessor 361 to the TEE 331. The codes and the memory area in the TEE 331 are controlled by an access control unit and cannot be accessed by programs in the Rich Execution Environment (REE) 332. Both the TEE 331 and the REE 332 may be formed in the application processor 33.

The microprocessor 36 may be coupled to the first drive circuit 31 via a Pulse Width Modulation (PWM) interface 362. The microprocessor 36 may be coupled to the infrared camera 20 via an Inter-Integrated Circuit (I2C) bus 70. The microprocessor 36 may provide clock information for acquiring infrared images and laser patterns to the infrared camera 20. The infrared images and laser patterns collected by the infrared camera 20 may be transmitted to the microprocessor 36 via the MIPI 361.

In an embodiment, an infrared template and a depth template for authentication may be stored in the TEE 331. The infrared template may be an infrared face image input by the user in advance, and the depth template may be a face depth image input by the user in advance. The infrared template and the depth template are stored in the TEE 331, and are not easy to be tampered with or stolen, such that the information in the terminal 100 is highly secure.

When the user needs to verify the identity, the microprocessor 36 controls the infrared camera 20 to collect the infrared image of the user, and transmits the infrared image to the TEE 331 of the application processor 33 after the infrared camera 20 collects the infrared image. The application processor 33 compares the infrared image with the infrared template in the TEE 331. If the infrared image matches the infrared template, the application processor 33 outputs the verification result indicating that the infrared template verification is passed. In the comparing process, the infrared image and the infrared template would not be acquired, falsified or stolen by other programs, improving the information security of the terminal 100.

Further, the microprocessor 36 may control the first drive circuit 31 to drive the laser projector 10 to project laser light, and control the infrared camera 20 to collect the laser pattern after modulation by the target object, and acquire and process the laser pattern to obtain the depth image. The depth image is transmitted to the TEE 331 of the application processor 33. The application processor 33 compares the depth image with the depth template in the TEE 331, and if the depth image matches the depth template, outputs the verification result indicating that the depth template verification is passed. In the comparing process, the depth image and the depth template would not be acquired, falsified or stolen by other programs, improving the information security of the terminal 100. In embodiments of the present disclosure, in order to prevent that the laser light continuously outputted by the laser projector 10 burns the user, the watchdog timer 34 may be controlled by the microprocessor 36 to switch off the first drive circuit 31 to further turn off the laser projector 10.

Figure 4:
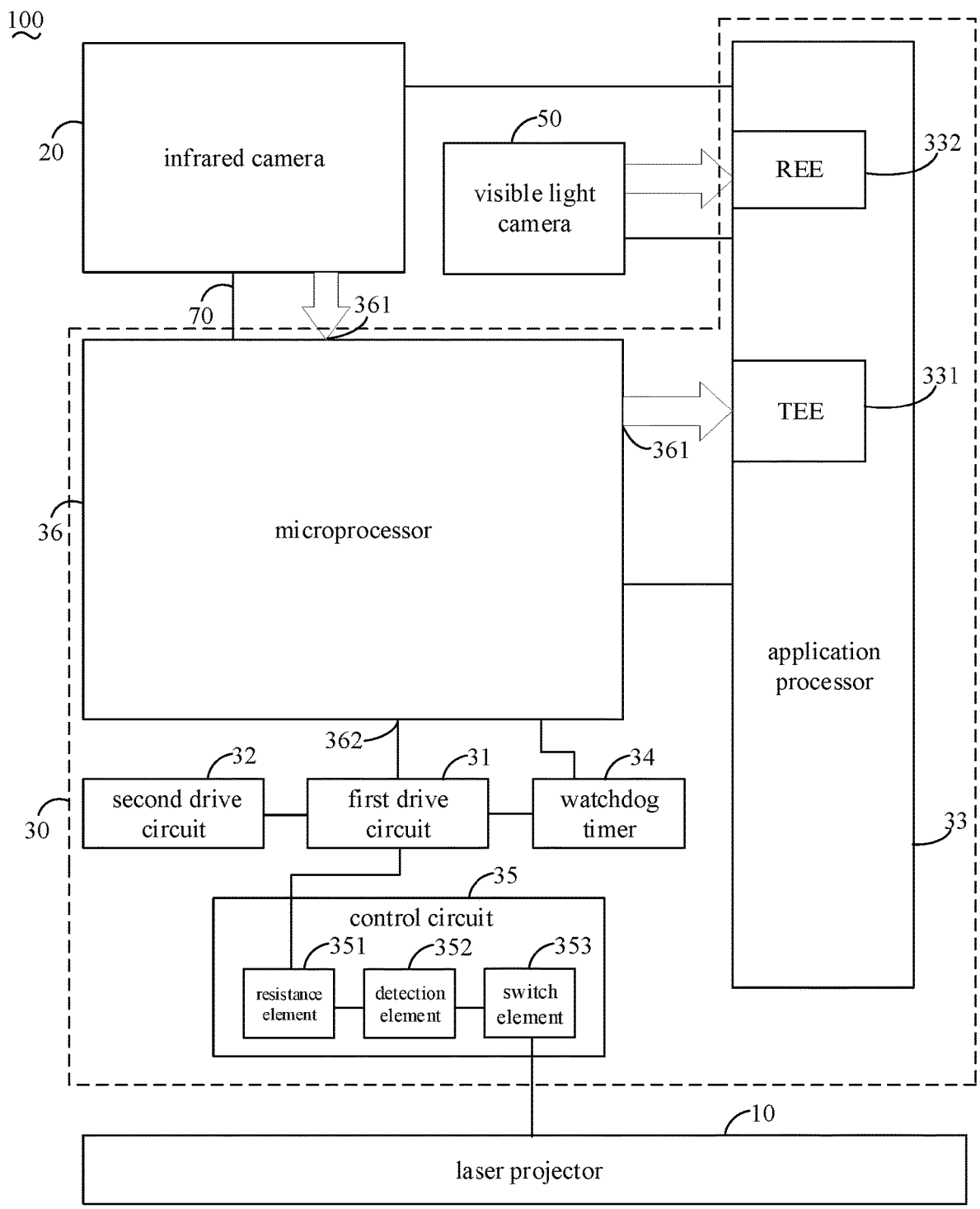
FIG. 4 is a block diagram illustrating a terminal according to some implementations of the present disclosure.

As illustrated in FIG. 4, the microprocessor 36 transmits the predetermined signal to the watchdog timer 34 at predetermined time intervals, to control the operation of the first drive circuit 31 by the watchdog timer 34. For example, the microprocessor 36 sends the predetermined signal to the watchdog timer 34 every 50 milliseconds. The watchdog timer 34 receives the predetermined signal transmitted by the microprocessor 36.

When the laser projector 10 continuously emits laser light, in other words, when the duration of outputting the electrical signal by the first drive circuit 31 is greater than or equal to the preset threshold, the first drive circuit 31 transmits the timeout signal to the microprocessor 36. When the microprocessor 36 receives the timeout signal transmitted by the first drive circuit 31, the microprocessor 36 stops transmitting the predetermined signal to the watchdog timer 34. The watchdog timer 34 is coupled to the first drive circuit 31, and the watchdog timer 34 is coupled to the microprocessor 36. The watchdog timer 34 is configured to switch off the first drive circuit 31 to further turn off the laser projector 10 when the predetermined signal is not received within a preset time period. The preset time period may be set before the terminal 100 leaves factory, or may be customized by the user on the terminal 100.

In embodiments of the present disclosure, the watchdog timer 34 may be a counter. After the watchdog timer 34 receives the predetermined signal, the watchdog timer 34 starts counting down from a certain number at a certain speed. If the first drive circuit 31 normally outputs the pulse signal, the microprocessor 36 retransmits the predetermined signal before the countdown reaches 0, and the watchdog timer 34 resets the countdown after receiving the predetermined signal. If the duration of outputting the electrical signal by the first drive circuit 31 is greater than or equal to the preset threshold, and the microprocessor 36 does not transmit the predetermined signal when the watchdog timer 34 counts to 0, the watchdog timer 34 is deemed to determine that the first drive circuit 31 is malfunctioning, and in this case, the watchdog timer 34 transmits a signal to switch off the first drive circuit 31 to further turn off the laser projector 10.

In an example, the watchdog timer 34 may be disposed external to the microprocessor 36, and the watchdog timer 34 may be an external timer chip, and the watchdog timer 34 may be coupled to an I/O pin of the microprocessor 36 to receive the predetermined signal transmitted by the microprocessor 36. The reliability of the external watchdog timer 34 is high. In another example, the watchdog timer 34 may be integrated into the microprocessor 36, and the functionality of the watchdog timer 34 may be implemented by the internal timer of the microprocessor 36, which simplifies the hardware circuit design of the control system 30.

In some implementations, the preset time period is [50, 150] milliseconds. In detail, the preset time period may be set to 50 milliseconds, 62 milliseconds, 75 milliseconds, 97 milliseconds, 125 milliseconds, 150 milliseconds, or any value within the above range. It can be understood that if the preset time period is set too short, the microprocessor 36 is required to transmit the predetermined signal too frequently, which may occupy too much processing space of the microprocessor 36 and cause the terminal 100 to be easily jammed. If the preset time period is set too long, the failure of the first drive circuit 31 cannot be detected in time, in other words, the laser projector 10 cannot be turned off in time, which is disadvantageous for the safe use of the laser projector 10. By setting the preset time period within [50, 150] milliseconds, it is possible to better balance the fluency and security of the terminal 100.

As illustrated in FIGS. 2 and 4, the control system 30 may further include a control circuit 35.

The control circuit 35 is coupled to the first drive circuit 31 and the laser projector 10 respectively. The control circuit 35 includes a resistance element 351, a detection element 352, and a switch element 353. The detection element 352 may be an ammeter, and the detection element 352 is coupled in series with the resistance element 351 and the first drive circuit 31 and is configured to detect the current flowing through the resistance element 351. The switch element 353 is coupled to the laser projector 10, and the switch element 353 is switched off to turn off the laser projector 10 when the current flowing through the resistance element 351 is greater than a predetermined current value.

In an example, when the first drive circuit 31 outputs the electrical signal to drive the laser projector 10 to project each frame of laser light, the current output by the first drive circuit 31 is successively increased. For example, the current output from the first drive circuit 31 is increased from 100 mA to 200 mA. When the first drive circuit 31 is malfunctioning, the first drive circuit 31 keeps outputting a high-level signal, and the current outputted by the first drive circuit 31 is continuously increased from 200 mA when the current has already increased from 100 mA to 200 mA. In this case, the predetermined current value may be set to 220 mA. Since the resistance element 351 is coupled in series with the first drive circuit 31, the current flowing through the first drive circuit 31 is the current flowing through the resistance element 351, and the switch element 353 is switched off to turn off the laser projector 10 when the current flowing through the resistance element 351 is greater than 220 mA.

Certainly, in other embodiments, the detection element 352 may be a voltmeter, and the detection element 352 is coupled in parallel with the resistance element 351 and configured to detect the voltage across both ends of the resistance element 351. The switch element 353 is switched off to turn off the laser projector 10 when the voltage across both ends of the resistance element 351 is greater than the predetermined voltage value, which will not be elaborated here.

Figure 5:
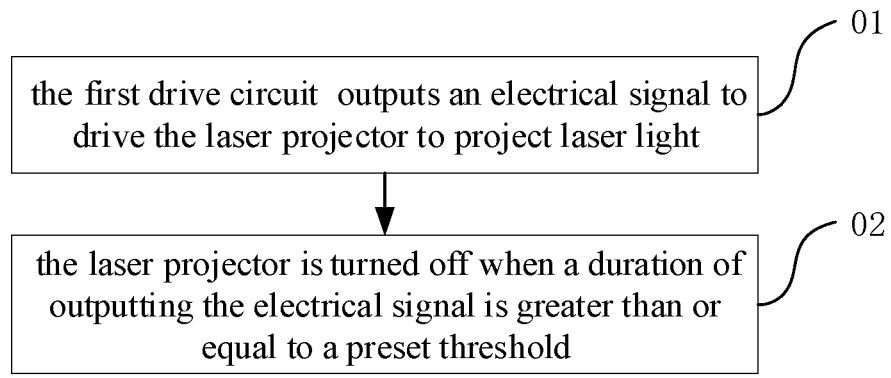
FIGS. 5 to 8 are flowcharts illustrating a method for controlling a laser projector according to some implementations of the present disclosure.

As illustrated in FIG. 5, the method for controlling the laser projector 10 according to implementations of the present disclosure is applied to control the laser projector 10. The laser projector 10 is coupled to the first drive circuit 31. The control method includes the followings.

At block 01, the first drive circuit 31 outputs an electrical signal to drive the laser projector 10 to project laser light.

At block 02, the laser projector 10 is turned off when a duration of outputting the electrical signal is greater than or equal to a preset threshold.

Figure 6:
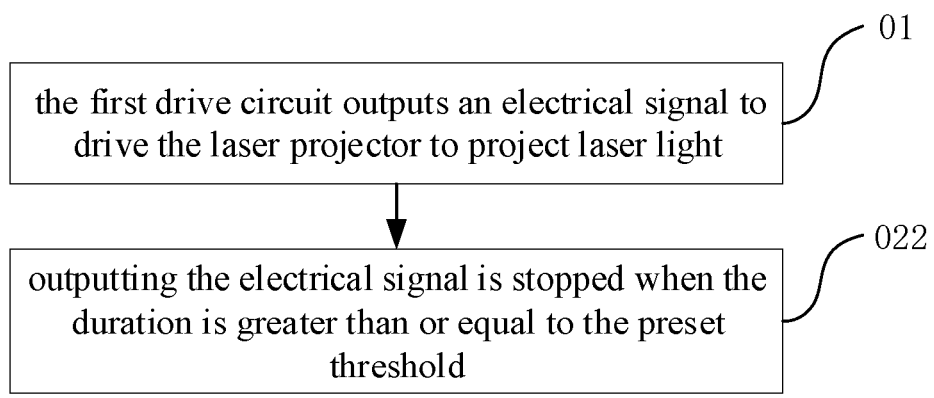

As illustrated in FIG. 6, in some implementations, the act of turning off the laser projector 10 when the duration of outputting the electrical signal is greater than or equal to the preset threshold (i.e., the act at block 02) includes the followings.

At block 022, outputting the electrical signal is stopped when the duration is greater than or equal to the preset threshold.

Figure 7:
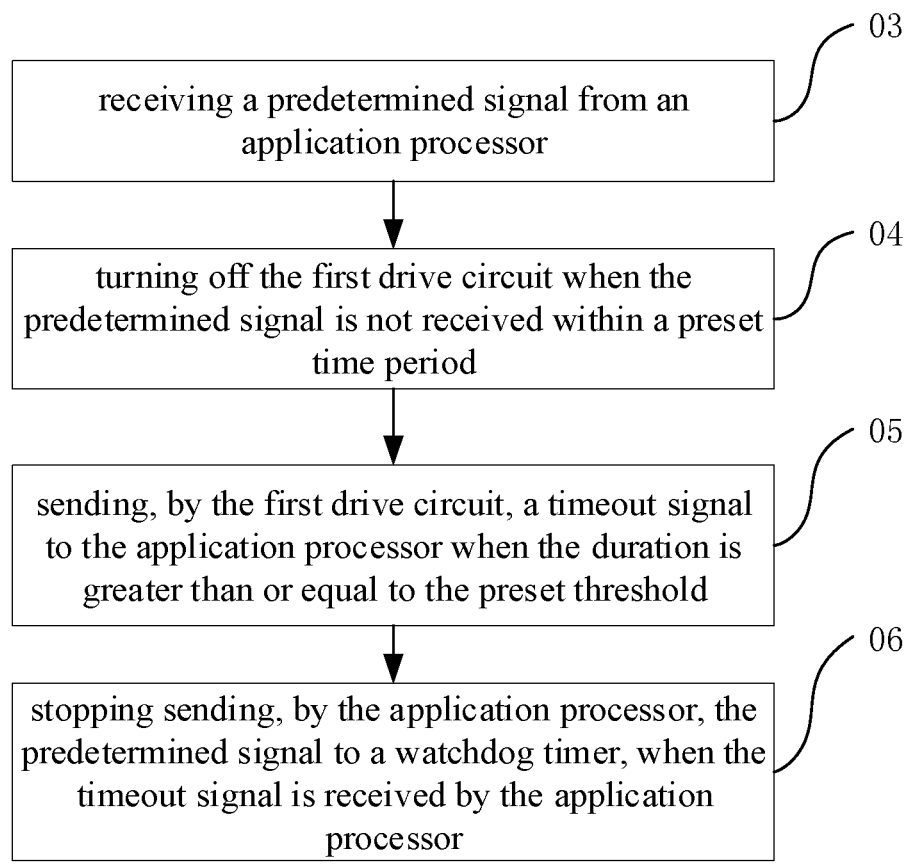

As illustrated in FIG. 7, in some implementations, the control method further includes the followings.

At block 03, a predetermined signal transmitted by the application processor 33 is received.

At block 04, the first drive circuit 31 is turned off when the predetermined signal is not received within a preset time period.

At block 05, the first drive circuit 31 sends a timeout signal to the application processor 33 when the duration is greater than or equal to the preset threshold.

At block 06, the application processor 33 stops sending the predetermined signal to the watchdog timer 34 in response to receiving the timeout signal.

Figure 8:
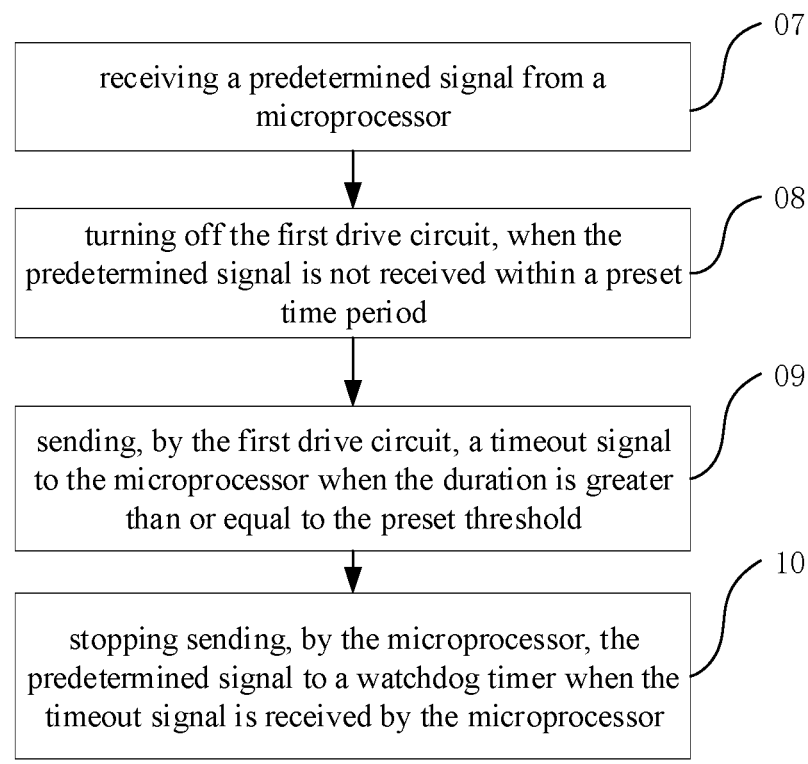

As illustrated in FIG. 8, in some implementations, the method further includes the following acts.

At block 07, the predetermined signal sent by the microprocessor 36 is received.

At block 08, the first drive circuit 31 is turned off when the predetermined signal is not received within the preset time period.

At block 09, the first drive circuit 31 sends a timeout signal to the microprocessor 36 when the duration is greater than or equal to the preset threshold.

At block 10, the microprocessor 36 stops sending the predetermined signal to the watchdog timer 34 in response to receiving the timeout signal.

In the method of controlling the laser projector 10 according to implementations of the present disclosure, if the duration of outputting the electrical signal by the first drive circuit 31 is greater than or equal to the preset threshold, it is determined that the first drive circuit 31 is malfunctioning, and the laser projector 10 is turned off, to prevent that the laser light continuously outputted by the laser projector 10 burns the user. For details of the implementation of the control method, reference may be made to the foregoing detailed description of the terminal 100, which is not elaborated here.

Figure 9:
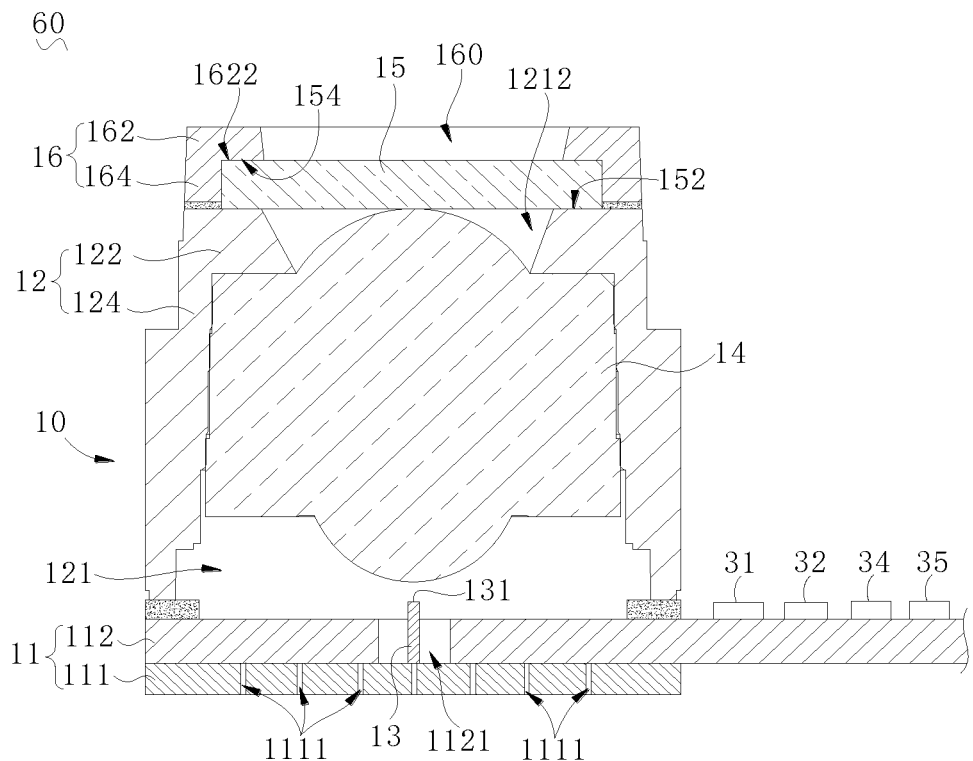
FIG. 9 is a schematic diagram illustrating a laser projector assembly according to some implementations of the present disclosure.

As illustrated in FIG. 9, implementations of the present disclosure further provide a laser projector assembly 60. The laser projector assembly 60 includes the laser projector 10, the first drive circuit 31, the second drive circuit 32, the watchdog timer 34, and the control circuit 35. In this case, the first drive circuit 31, the second drive circuit 32, and the watchdog timer 34 may all be integrated onto a substrate assembly 11 of the laser projector 10.

As illustrated in FIG. 9, in some implementations, the laser projector 10 includes the substrate assembly 11, a lens barrel 12, a light source 13, a collimating element 14, a diffractive optical element (DOE) 15, and a protective cover 16.

The substrate assembly 11 includes a substrate 111 and a circuit board 112. The circuit board 112 is disposed on the substrate 111. The circuit board 112 is configured to connect the light source 13 and the main board of the terminal 100. The circuit board 112 may be a hard board, a soft board or a rigid-flex board. In the embodiment as illustrated in FIG. 9, a through hole 1121 is formed in the circuit board 112, and the light source 13 is fixed on the substrate 111 and electrically coupled to the circuit board 112. A heat dissipation hole 1111 may be formed on the substrate 111. The heat generated during the operation of the light source 13 or the circuit board 112 may be dissipated by the heat dissipation hole 1111. The heat dissipation hole 1111 may also be filled with thermal conductive adhesive to further improve the heat dissipation performance of the substrate assembly 11.

The lens barrel 12 is fixedly coupled to the substrate assembly 11. The lens barrel 12 is formed with a receiving cavity 121. The lens barrel 12 includes a top wall 122 and an annular peripheral wall 124 extending from the top wall 122. The peripheral wall 124 is disposed on the substrate assembly 11, and a light hole 1212 communicating with the receiving cavity 121 is defined in the top wall 122. The peripheral wall 124 may be coupled to the circuit board 112 by glue.

The protective cover 16 is disposed on the top wall 122. The protective cover 16 includes a baffle 162 having a light emitting through hole 160 and an annular side wall 164 extending from the baffle 162.

The light source 13 and the collimating element 14 are both disposed in the receiving cavity 121, and the diffractive optical element 15 is disposed on the lens barrel 12. The collimating element 14 and the diffractive optical element 15 are sequentially disposed on the light-emitting path of the light source 13. The collimating element 14 collimates the laser light emitted by the light source 13, and the laser light passes through the collimating element 14 and then passes through the diffractive optical element 15 to form a laser pattern.

Figure 10:
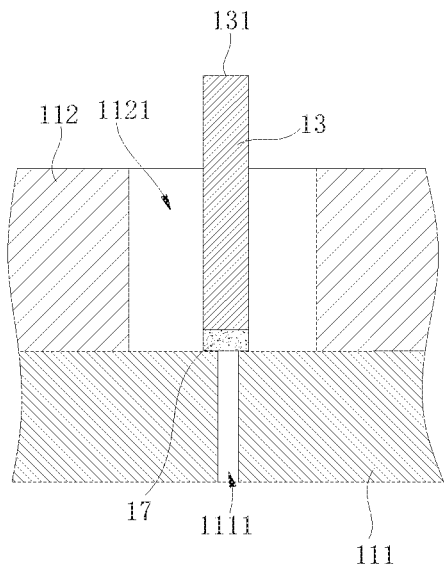
FIGS. 10 to 12 are schematic diagrams illustrating a part of a laser projector according to some implementations of the present disclosure.
Figure 11:
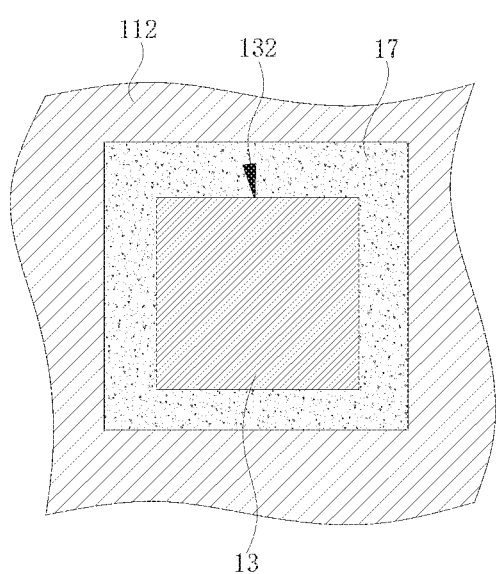

The light source 13 may be a Vertical Cavity Surface Emitting Laser (VCSEL) or an edge-emitting laser (EEL). In the embodiment as illustrated in FIG. 9, the light source 13 is an edge emitting laser. The light source 13 may be a Distributed Feedback Laser (DFB). The light source 13 is configured to emit laser light into the receiving cavity 121. As illustrated in FIG. 10, the light source 13 has a columnar shape as a whole, and the light source 13 forms a light emitting surface 131 away from one end surface of the substrate assembly 11, and the laser light is emitted from the light emitting surface 131, and the light emitting surface 131 faces the collimating element 14. The light source 13 is fixed on the substrate assembly 11. In detail, the light source 13 may be adhered to the substrate assembly 11 by a sealant 17, for example, a side of the light source 13 opposite to the light emitting surface 131 is adhered to the substrate assembly 11. As illustrated in FIGS. 9 and 11, the side surfaces 132 of the light source 13 may also be adhered to the substrate assembly 11, and the sealant 17 wraps around the side surfaces 132. Alternatively, only one or some of the side surfaces 132 may be bonded to the substrate assembly 11. In this case, the sealant 17 may be a thermal conductive adhesive to conduct heat generated during the operation of the light source 13 to the substrate assembly 11.

As illustrated in FIG. 9, the diffractive optical element 15 is disposed on the top wall 122 and received within the protective cover 16. The opposite sides of the diffractive optical element 15 respectively abuts the protective cover 16 and the top wall 122. The baffle 162 includes an abutting surface 1622 adjacent to the light hole 1212, and the diffractive optical element 15 abuts the abutting surface 1622.

In detail, the diffractive optical element 15 includes a diffractive incident face 152 and a diffractive exit surface 154 opposed thereto. The diffractive optical element 15 is disposed on the top wall 122, and the diffractive exit surface 154 abuts the surface of the baffle 162 near the light through hole 1212 (the abutting surface 1622), and the diffractive incident surface 152 abuts the top wall 122. The light through hole 1212 is aligned with the receiving cavity 121, and the light emitting hole 160 is aligned with the light through hole 1212. The top wall 122, the annular side wall 164, and the baffle 162 abuts the diffractive optical element 15, thereby preventing the diffractive optical element 15 from falling out of the protective cover 16 in the light exiting direction. In some implementations, the protective cover 16 is adhered to the top wall 122 by glue.

The light source 13 of the laser projector 10 adopts the edge emitting laser. On one hand, the temperature drift of the edge emitting laser is smaller than that of the VCSEL array. On the other hand, since the edge emitting laser has a single-point light emitting structure, it is not necessary to design an array structure, and thus the fabrication is simple, and the light source of the laser projector 10 is low in cost.

When the laser light of the DFB is propagating, the gain of power is obtained through the feedback of the grating structure. To increase the power of the DFB, it is necessary to increase the injection current and/or increase the length of the DFB. As the injection current increases, the power consumption of the DFB increases and the heat generation is severe. Therefore, in order to ensure that the DFB can work normally, it is necessary to increase the length of the DFB, such that the DFB generally has a slender shape. When the light emitting surface 131 of the edge emitting laser faces the collimating element 14, the edge emitting laser is placed vertically, and since the edge emitting laser has the slender shape, the edge emitting laser is prone to accidents such as dropping, shifting or shaking. Therefore, the sealant 17 is provided to hold the edge emitting laser, preventing accidents such as dropping, displacement or shaking of the edge emitting laser.

Figure 12:
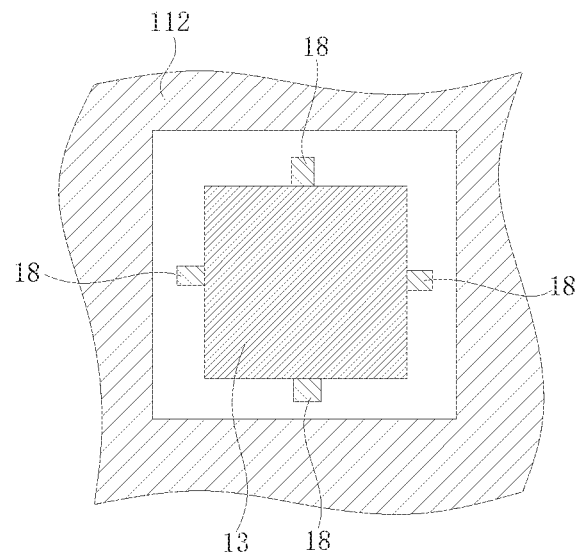

As illustrated in FIGS. 9 and 12, in some implementations, the light source 13 may also be fixed to the substrate assembly 11 in a manner as illustrated in FIG. 12. In detail, the laser projector 10 includes a plurality of support blocks 18 that can be fixed to the substrate assembly 11. The plurality of support blocks 18 collectively enclose the light source 13, and the light source 13 may be directly mounted among the plurality of support blocks 18 during installation. In one example, the plurality of support blocks 18 collectively clamp the light source 13 to further prevent the light source 13 from shaking.

In some implementations, the protective cover 16 may be omitted. In this case, the diffractive optical element 15 may be disposed in the receiving cavity 121, and the diffractive exit surface 154 of the diffractive optical element 15 may abut against the top wall 122, and the laser light passes through the diffractive optical element 15 and then through the light through hole 1212. Thus, the diffractive optical element 15 is less likely to fall off.

In some implementations, the substrate 111 may be omitted and the light source 13 may be directly fixed to the circuit board 112 to reduce the overall thickness of the laser projector 10.

Figure 13:
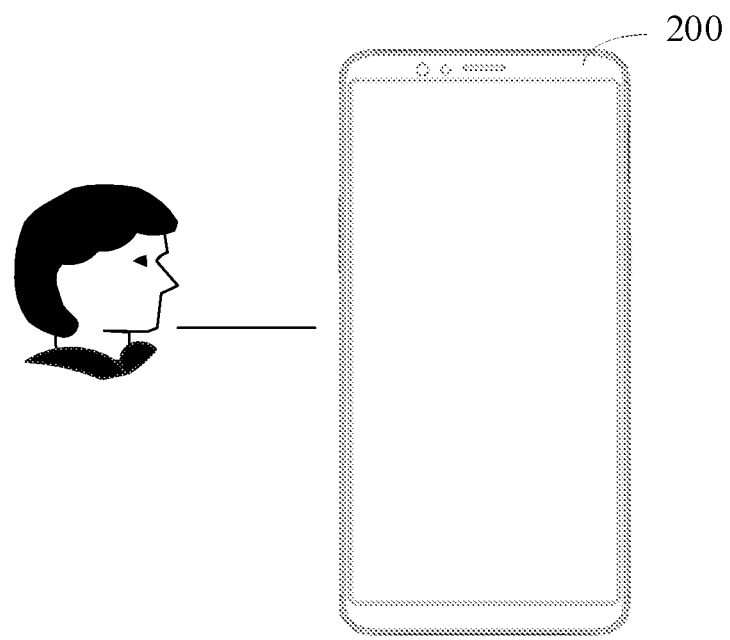
FIG. 13 is a diagram illustrating an application scenario of a method for controlling a laser light output according to some implementations of the present disclosure.

FIG. 13 is a diagram illustrating an application scenario of a method for controlling laser light output according to some implementations of the present disclosure. As illustrated in FIG. 13, the application scenario includes an electronic device (hereinafter collectively referred to as terminal) 200. The terminal 200 may be installed with a camera module, and may also be installed with a plurality of applications. The camera module may include a laser module. The terminal 200 may detect whether the laser module is turned on. When detecting that the laser module is turned on, the terminal 200 may record a first time point for turning on the laser module, obtain a time internal from the first time point to a current operating time point of the laser module, and control the laser light output of the laser module when the time interval satisfies a preset time period. The terminal 200 may be a smartphone, a tablet, a personal digital assistant, a wearable device, or the like.

Figure 14:
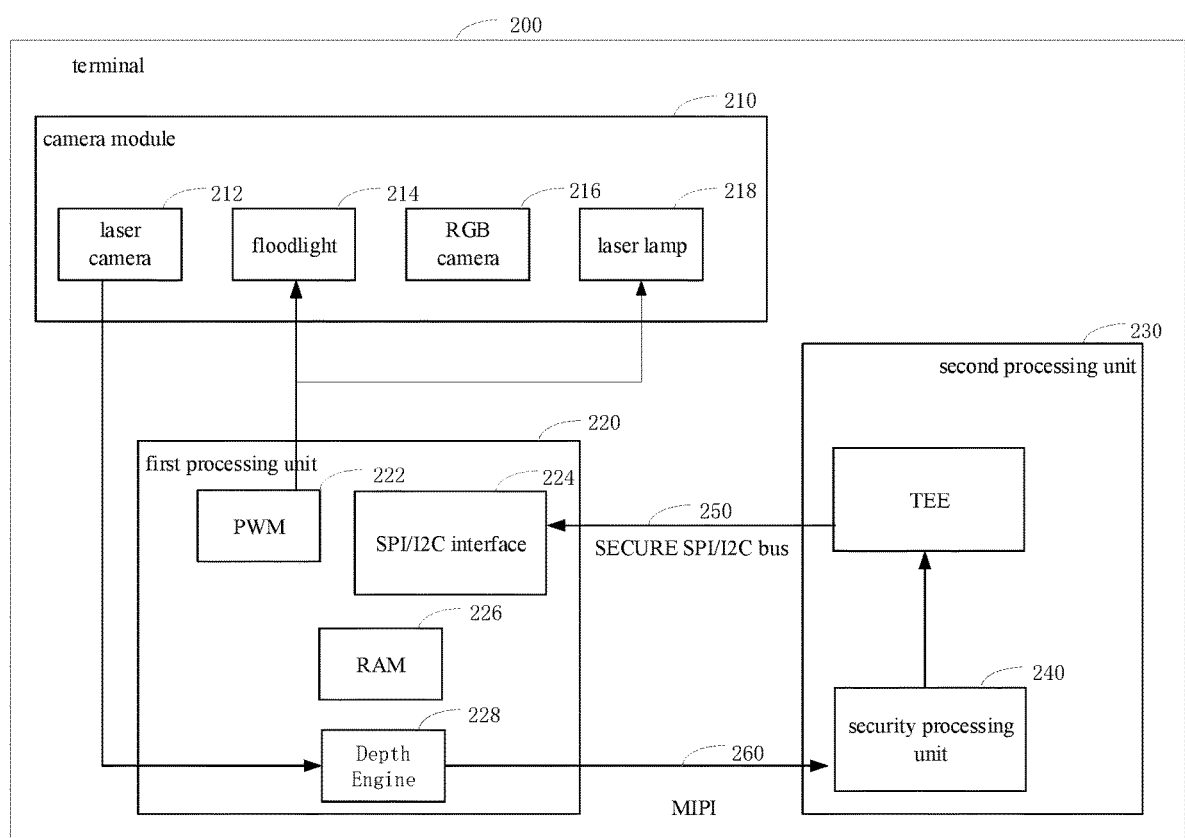
FIG. 14 is a block diagram illustrating an internal structure of a terminal according to some implementations of the present disclosure.

FIG. 14 is a schematic diagram illustrating an internal structure of a terminal according to some implementations of the present disclosure. As illustrated in FIG. 14, the terminal 200 may include a camera module 210, a first processing unit 220, a second processing unit 230, a security processing unit 240. The first processing unit 220 is coupled to the camera module 210, the second processing unit 230, and the security processing unit 240, respectively.

The camera module 210 may include a first image collector, a first projector, a second image collector, and a second projector. The first image collector, the first projector, and the second projector are coupled to the first processing unit 220. The second image collector may be coupled to the first processing unit 220 or the second processing unit 230. The first image collector may be a laser camera 212 (i.e., an infrared camera). The first projector may be a floodlight 214. The second image collector may be a Red/Green/Blue (RGB) camera 216. The second projector may be a laser lamp 218 (i.e., a laser projector). The second projector and the first image collector form a laser module. Each of the laser camera 212 and the RGB camera 216 may include elements such as lenses and image sensors. The image sensor is generally a Complementary Metal Oxide Semiconductor (CMOS) or a charge coupled device (CCD). Filters corresponding to respective pixels may be set at the surface of the image sensor in the laser camera 212, to realize extraction of light of different wavelengths, so that the laser camera 212 may collect invisible light images of different wavelengths. The wavelength of light that is allowed to pass through the filters coincides with the wavelength of the light emitted by the laser lamp 218, such as infrared light, ultraviolet light, or the like. The RGB camera 216 may use Bayer filters to acquire light intensity information of three channels (R/G/B) respectively, and collect color images of the target object. The floodlight 214 may be a laser diode, an LED. The illuminating wavelength of the floodlight 214 is identical to that of the laser lamp 218. The second projector may include a light source, a collimating lens, and a structured light pattern generator, wherein the light source may be a surface emitting laser, a VCSEL array, and the structured light pattern generator may be frosted glass, DOE or a combination thereof.

The first processing unit 220 may be a Microcontroller Unit (MCU). The MCU may include Pulse Width Modulation (PWM) 222, Serial Peripheral Interface/Inter-Integrated Circuit (SPI/I2C) 224, Random Access Memory (RAM) 226 and depth engine 228. The MCU may control, by the PWM, the floodlight 214 and the laser camera 212 to be synchronized with each other. The floodlight 214 emits floodlight to the target object, and the floodlight image is collected by the laser camera 212. If the floodlight 214 emits infrared light, the infrared image is collected. The MCU controls the laser lamp 218 and the laser camera 212 by the PWM to make them synchronized with each other. The laser lamp 218 projects the structured light pattern to the target object, and the target speckle image is collected by the laser camera 212.

In an embodiment, the laser light 218 pre-projects a structured light pattern (a pattern with speckle particles) onto a reference plane at a known distance from the terminal, the pattern is captured by the laser camera 212 and used as a reference speckle image. The reference speckle image may be saved in the memory of the first processing unit 220, or may be saved in the memory of the second processing unit 230, or may be saved in the memory of the security processing unit 240. The memory is a non-volatile memory.

The second processing unit 230 may be a CPU processor. The second processing unit 230 includes a CPU core running under a TEE and a CPU core running under a REE. Both TEE and REE are operating modes of an Advanced RISC Machines (ARM) module. Generally, the operation behaviors requiring higher security in the terminal needs to be performed in the TEE, and other operation behaviors may be performed in the REE. In embodiments of the present disclosure, when the second processing unit 230 receives a request for acquiring the face information from an application, for example, when the application requires the face information to perform unlock or payment, the CPU core running in the TEE may send a face acquisition command to the SPI/I2C interface 224 of the first processing unit 220 through a SECURE SPI/I2C bus 250, and by transmitting pulses with the PWM 222, control the floodlight 214 of the camera module 210 to be turned on for collecting the infrared image and control the laser lamp 218 in the control camera module 210 to be turned on for collecting the target speckle image. The camera module 210 may transmit the acquired infrared image and depth image to the depth engine 238 in the first processing unit 220 for processing. The depth engine 238 may calculate based on the acquired target speckle image and the reference speckle image to obtain a parallax image with offset information of a point in the target speckle image and a corresponding point in the reference speckle image, and process the parallax image to obtain the depth image. The first processing unit 220 may send the parallax image to the security processing unit 240 through the MIN for processing to obtain the depth image.

The first processing unit 220 performs face recognition according to the acquired infrared image, detects whether there is a human face in the infrared image, and detects whether the detected human face matches the stored human face. When the face recognition is passed, the first processing unit 220 determines whether the human face has biological activity by performing a living body detection according to the infrared image and the depth image. In an embodiment, after acquiring the infrared image and the depth image, the first processing unit 220 may perform the living body detection first and then perform the face recognition, or perform the face recognition and the bio-assay at the same time. If the face recognition is passed and it is determined that the detected human face has biological activity, the first processing unit 220 may transmit the intermediate information of the infrared image and the depth image to the security processing unit 240. The security processing unit 240 may calculate the depth information of the human face from the intermediate information of the infrared image and the depth image, and transmit the depth information to the CPU core in the TEE.

The security processing unit 240 may be a separate processor or a security area formed by hardware and software isolation in the second processing unit 230. For example, the second processing unit 230 may be a multi-core processor, in which one core is defined as the security processing unit for calculating depth information of the human face, matching the acquired infrared image with the stored infrared image, matching the acquired depth image with the stored depth image, and the like. The security processing unit 240 may process the data in parallel or in serial.

Figure 15:
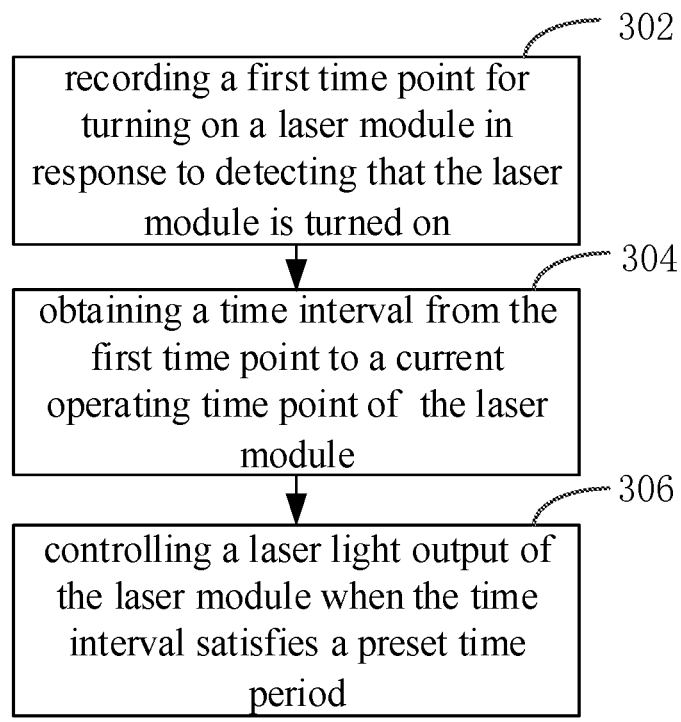
FIG. 15 is a flowchart illustrating a method for controlling a laser light output according to some implementations of the present disclosure.

In one embodiment, a method for controlling a laser light output is provided. For example, the method is applied to the above terminal. As illustrated in FIG. 15, the method includes the followings.

At block 302, a first time point for turning on a laser module is recorded in response to detecting that the laser module is turned on.

A camera module may be installed on the terminal, and images may be acquired through the installed camera module. The camera module may be subdivided into the laser module and the visible light module according to different images obtained. The laser module may acquire an image formed by projecting laser light to an object, and the visible light module may obtain an image formed by projecting visible light to the object.

The terminal may detect the operating state of the installed camera module. In detail, the terminal may detect the operating states of the laser module and the visible light module in the camera module. The operating state of the laser module may be a turn-on state or a turn-off state, and the laser module may switch between the two states. The first time point refers to a specific time point when the operating state of the laser module is the turn-on state. When the terminal detects that the operating state of the laser module is the turn-on state, the terminal may record the first time point when the laser module is turned on. In one example, the first processing unit 220 may be configured to record the first time point in response to detecting that the laser module is turned on.

At block 304, a time interval from the first time point to a current operating time point of the laser module is obtained.

The current operating time point of the laser module refers to the specific time point when the current operating state of the laser module is the turn-on state. The terminal may obtain the specific time point when the current operating state of the laser module is the turn-on state, in other words, the current time point at which the laser module is working. The terminal may calculate the time difference between the current time point and the first time point, and the time difference is the time interval between the current operating time point of the laser module and the first time point. In one example, the first processing unit 220 may be configured to obtain the time interval between the current operating time point of the laser module and the first time point.

At block 306, the laser light output of the laser module is controlled when the time interval satisfies a preset time period.

The preset time period refers to a period of time set in advance. For example, the preset time period may be 5 seconds. After the terminal calculates the time interval, the calculated time interval is compared with the preset time period. When the time interval satisfies the preset time period, the terminal may control the laser light output of the laser module. In one example, the first processing unit 220 may be configured to control the laser light output of the laser module when the time interval satisfies the preset time period.

When detecting that the laser module is turned on, the first time point for turning on the laser module is recorded, the time interval from the first time point to the current operating time point of the laser module is obtained, and the laser light output of the laser module is controlled when the time interval satisfies the preset time period. The terminal obtains the time interval from the first time point to the current operating time point of the laser module, compares the time interval with the preset time period, and then controls the laser light output of the laser module according to the comparison result, thereby preventing the laser module from continuously outputting the laser light, and further reducing harm to the eyes of the user.

In the method for controlling the laser light output according to an embodiment, when the time interval satisfies the preset time period, the laser light output of the laser module may be controlled as follows. When the time interval satisfies the preset time period, an operating frequency of the laser module is reduced.

The terminal may obtain a comparison result by comparing the time interval with the preset time period. When the comparison result obtained by the terminal indicates that the time interval satisfies the preset time period, the terminal may control the laser module, such that the operating frequency of the laser module is reduced compared to the original operating frequency. For example, the current operating frequency of the laser module is 15 MHz, and the preset time period is 5 seconds, and when the time interval obtained by the terminal is 6 seconds, the terminal may determine that the obtained time interval (which is 6 seconds) satisfies the preset time period (i.e., 5 seconds), and thus the terminal may control the laser module to reduce the operating frequency of the laser module to 5 MHz. It is possible to reduce the number of times the laser module emits laser speckles from 30 times per second to one time per second.

When the time interval satisfies the preset time period, the terminal may prevent the laser module from outputting laser light for a long time and with a high frequency by reducing the operating frequency of the laser module, which can save resources and reduce harm to the human eyes.

In the method for controlling the laser light output according to another embodiment, when the time interval satisfies the preset time period, the laser light output of the laser module may be controlled as follows. When the time interval satisfies the preset time period, an operating current of the laser module is reduced.

The terminal may compare the time interval with the preset time period to obtain a comparison result. When the comparison result obtained by the terminal indicates that the time interval satisfies the preset time period, the terminal may control the laser module, such that the operating current of the laser module is reduced compared to the original operating current. For example, the current operating current of the laser module is 20 milliamps (mA), and the preset time interval is 5 seconds, and when the time interval obtained by the terminal is 6 seconds, the terminal may determine that the obtained time interval (which is 6 seconds) satisfies the preset time period (i.e., 5 seconds), and the terminal may control the laser module to reduce the operating current of the laser module to 5 milliamps (mA). It is possible to reduce the number of times the laser module emits laser speckles from 30 times per second to one time per second.

When the time interval satisfies the preset time period, the terminal may prevent the laser module from outputting laser light for a long time by reducing the operating current of the laser module, which can save resources and reduce harm to the human eyes.

Figure 16:
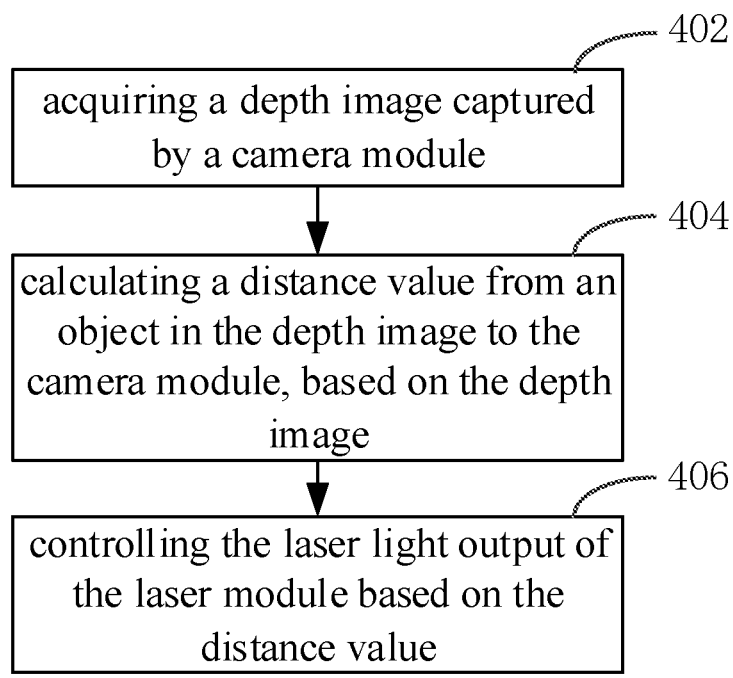
FIG. 16 is a flowchart illustrating a method for controlling an output of a laser module based on a distance value according to some implementations of the present disclosure.

As illustrated in FIG. 16, in an embodiment, the method for controlling the laser light output may further include a process of controlling output of the laser module according to a distance value, which includes the followings.

At block 402, a depth image acquired by a camera module is obtained.

When the laser lamp in the camera module is turned on, the terminal may collect a speckle image through the laser camera. The terminal receives an image acquisition command sent by the camera module, and may collect the speckle image through the laser camera according to the received image acquisition command, and the processing unit in the terminal calculates the depth image according to the speckle image. In one example, the first processing unit 220 (especially, the depth engine 238) or the security processing unit 240 may be configured to obtain the depth image acquired by the camera module.

At block 404, a distance value from an object in the depth image to the camera module is calculated based on the depth image.

The object in the image refers to a specific object in the depth image. For example, when the depth image acquired by the terminal includes a human face, the object in the image is the real human face. The terminal may calculate the distance value from the object in the depth image to the camera module according to the acquired depth image. For example, when the depth image acquired by the terminal includes the human face, the terminal may calculate the distance value between the real human face to the camera module of the terminal according to the depth image as 20 cm. In one example, the first processing unit 220 or the security processing unit 240 may be configured to calculate the distance value from the object in the depth image to the camera module based on the depth image.

At block 406, the laser light output of the laser module is controlled based on the distance value.

The terminal may control the output of the laser module according to the calculated distance value. For example, the terminal may control the operating frequency or the operating current of the laser module according to the distance value. In one example, the first processing unit 220 may be configured to control the laser light output of the laser module based on the distance value.

By obtaining the depth image acquired by the camera module, the distance value from the object in the depth image to the camera module is calculated according to the depth image, and the laser light output of the laser module is controlled according to the distance value. The terminal controls the output of the laser module according to the distance value from the object in the depth image to the camera module. When the object in the image is the human face, the terminal may reduce harm to the human eyes by controlling the laser light output of the laser module.

In one embodiment, the laser light output of the laser module may be controlled according to the distance value as follows. The laser module is controlled to be turned off when the distance value is less than or equal to a first preset distance value, and the operating frequency or operating current of the laser module is reduced when the distance value is greater than the first preset distance and less than or equal to a second preset distance value.

The first preset distance value and the second preset distance value may be values set in advance, and the first preset distance value is less than the second preset distance value. When the distance value is less than or equal to the first preset distance value, it indicates that the distance from the object in the image to the camera module is relatively close, and the terminal may control the laser module to be turned off. For example, the object in the image is the human face, the first preset value is 20 cm, and when the distance value from the face to the camera module calculated by the terminal is 10 cm, the terminal may control the laser module to be forcibly turned off.

When the distance value is greater than the first preset distance value and less than or equal to the second preset distance value, it indicates that the distance from the object in the image to the camera module is still relatively close, and the terminal may control the laser light output of the laser module by reducing the operating frequency or the operating current of the laser module. For example, the object in the image is a human face, the first preset distance value is 20 cm, the second preset distance value is 30 cm, and the laser module emits laser speckles 30 times per second. In this case, when the distance value from the object in the image to the camera module calculated by the laser module is 25 cm, the terminal may reduce the number of times the laser module emits laser speckles from 30 times per second to one time per second by reducing the operating frequency or operating current of the laser module.

When the distance value is less than or equal to the first preset distance value, the laser module is controlled to be turned off, and when the distance value is greater than the first preset distance value and less than or equal to the second preset distance value, the operating frequency or the operating current of the laser module is reduced. The terminal controls the laser light output of the laser module according to the calculated distance value from the object in the image to the camera module, which can reduce damage of the laser to the human eyes.

In an embodiment, the method for controlling the laser light output may further include acquiring a change frequency of image content in images captured by the camera module, and controlling the output of the laser module based on the change frequency.

The change frequency of the image content refers to the frequency of the motion of the object in the images. For example, when the image content is a human face, the change frequency of the image content is the frequency at which the human face moves in the camera. The terminal may control the laser light output of the laser module according to the change frequency of the image content. In one example, the first processing unit 220 or the security processing unit 240 may be configured to acquire the change frequency of the image content in the images collected by the camera module, and control the output of the laser module according to the change frequency.

Figure 17:
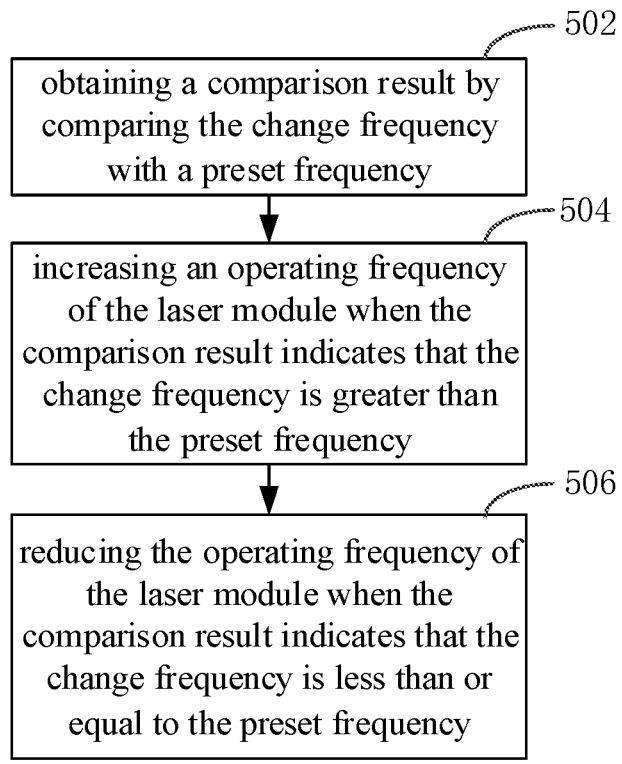
FIG. 17 is a flowchart illustrating a method for controlling an output of a laser module based on a change frequency according to some implementations of the present disclosure.

As illustrated in FIG. 17, in an embodiment, the method for controlling the laser light output may further include a process of controlling the laser light output of the laser module according to the change frequency, which specifically includes the followings.

At block 502, a comparison result is acquired by comparing the change frequency and a preset frequency.

The preset frequency refers to the preset number of times the object changes its position over a period of time. The terminal may compare the change frequency of the image content in the acquired images and the preset frequency to obtain the comparison result. For example, the preset frequency is 1 time per second, the image content in the image is a human face, and the change frequency of the human face is 2 times per second, and the terminal may compare the change frequency and the preset frequency to obtain a comparison result in which the change frequency is greater than the preset frequency, by comparing the change frequency and the preset frequency. In one example, the first processing unit 220 or the security processing unit 240 may be configured to compare the change frequency and the preset frequency to obtain the comparison result.

At block 504, an operating frequency of the laser module is increased when the comparison result indicates that the change frequency is greater than the preset frequency.

When the comparison result obtained by the terminal indicates that the change frequency is greater than the preset frequency, it indicates that the position of the image content in the images changes frequently, and the terminal may control the laser module to increase the operating frequency. For example, the change frequency obtained by the terminal is 2 times per second, the preset frequency is 1 time per second, and the change frequency is greater than the preset frequency, which indicates that the position of the human face changes frequently, and the terminal may control the laser module to increase the operating frequency to adapt the frequent changes of position of the human face. In one example, the first processing unit 220 may be configured to increase the operating frequency of the laser module when the comparison result indicates that the change frequency is greater than the preset frequency.

At block 506, the operating frequency of the laser module is reduced when the comparison result indicates that the change frequency is less than or equal to the preset frequency.

When the comparison result obtained by the terminal is that the change frequency is less than or equal to the preset frequency, it indicates that the number of times the position of the image content changes in the image is small, and the terminal may control the laser module to reduce the operating frequency. For example, the change frequency obtained by the terminal is 2 times per second, the preset frequency is 3 times per second, and the change frequency is less than the preset frequency, which indicates that the change of position of the human face is relatively rare, and the terminal may control the laser module to reduce the operating frequency to save resources. In one example, the first processing unit 220 may be configured to reduce the operating frequency of the laser module when the comparison result indicates that the change frequency is less than or equal to the preset frequency.

The comparison result is obtained by comparing the change frequency and the preset frequency. When the comparison result indicates that the change frequency is greater than the preset frequency, the operating frequency of the laser module is increased, and when the comparison result indicates that the change frequency is less than or equal to the preset frequency, the operating frequency of the laser module is reduced. The terminal controls the laser light output of the laser module according to the change frequency of the image content in images, so that the utilization of the laser module is maximized, and the damage to the human eyes can be reduced while saving resources.

In an embodiment, the method for controlling the laser light output may be applied in a video call. When the user uses the terminal for a video call, the laser module in the camera module needs to be turned on. The terminal may record the first time point for turning on the laser module in response to detecting that the laser module is turned on. When the user performs the video call, the laser module is always in the turn-on state, and the terminal may obtain the time interval from the first time point to the current operating time point of the laser module during the video call. When the time interval satisfies the preset time period, the terminal may reduce the operating frequency or operating current of the laser module.

The terminal may also acquire the depth image acquired by the camera during the video call, and calculate the distance value from the user to the camera module according to the depth image. When the distance value from the user to the camera module is less than or equal to the first preset distance value, the terminal may control the laser module to be turned off to reduce the damage of the laser module to human eyes. When the distance value from the user to the camera module is greater than the first preset distance value and less than or equal to the second preset distance value, the terminal may reduce the operating frequency or operating current of the laser module to reduce the damage of the laser module to human eyes.

The terminal may further obtain the change frequency of the position of the user in the images captured by the camera module during the video call. When the position of the user changes frequently, and the change frequency is greater than the preset frequency, the terminal may increase the operating frequency or operating current of the laser module, and when the position of the user rarely changes, and the change frequency is less than or equal to the preset frequency, the terminal may reduce the operating frequency or operating current of the laser module, thereby reducing the damage to the user's eyes.

In an embodiment, the method for controlling the laser light output may be applied in live broadcast. When the user performs live broadcast through the terminal, the laser module in the camera module needs to be turned on. The terminal may record the first time point for turning on the laser module in response to detecting that the laser module is turned on. When the user performs live broadcast, the laser module is always in the turn-on state, and the terminal may obtain the time interval from the first time point to the current operating time point of the laser module during the live broadcast. When the time interval satisfies the preset time period, the terminal may reduce the operating frequency or operating current of the laser module.

The terminal may also acquire the depth image collected by the camera during the live broadcast of the user, and calculate the distance value from the user to the camera module according to the depth image. When the distance value from the user to the camera module is less than or equal to the first preset distance value, the terminal may control the laser module to be turned off to reduce the damage of the laser module to the user's eyes. When the distance value from the user to the camera module is greater than the first preset distance value and less than or equal to the second preset distance value, the terminal may reduce the operating frequency or operating current of the laser module to reduce the damage of the laser module to the user's eyes.

The terminal may further obtain the change frequency of the position of the user in the images collected by the camera module during the live broadcast. When the position of the user changes frequently, and the change frequency is greater than the preset frequency, the terminal may increase the operating frequency or operating current of the laser module. When the position of the user rarely changes and the change frequency is less than or equal to the preset frequency, the terminal may reduce the operating frequency or operating current of the laser module to reduce the damage to the user's eyes.

In an embodiment, a method for controlling a laser light output is provided. The method may be specifically implemented as follows.

First, the terminal may record recording the first time point for turning on the laser module in response to detecting that the laser module is turned on. The terminal may detect the operating state of the installed camera module. In detail, the terminal may detect the operating states of the laser module and the visible light module in the camera module. The operating state of the laser module may be the turn-on state or the turn-off state, and the laser module may switch between the two states. The first time point refers to a specific time point when the operating state of the laser module is the turn-on state. When the terminal detects that the operating state of the laser module is the turn-on state, the terminal may record the first time point of turning on the laser module.

Then, the terminal may obtain the time interval from the first time point to the current operating time point of the laser module. The current operating time point of the laser module refers to the specific time point when the current operating state of the laser module is the turn-on state. The terminal may obtain the specific time point when the current operating state of the laser module is the turn-on state, in other words, the current time point at which the laser module is operating. The terminal may calculate the time difference between the current time point and the first time point, and the time difference is the time interval between the current operating time point of the laser module and the first time point.

Further, when the time interval satisfies the preset time period, the terminal may control the laser light output of the laser module. The preset time period refers to a period of time set in advance. For example, the preset time period may be 5 seconds. After the terminal calculates the time interval, the calculated time interval is compared with the preset time period. When the time interval satisfies the preset time period, the terminal may control the laser light output of the laser module.

The terminal may control the laser light output of the laser module by reducing the operating frequency of the laser module. When the time interval satisfies the preset time duration, the terminal may control the laser module, such that the operating frequency of the laser module is reduced compared to the original operating frequency. The terminal may also control the laser light output of the laser module by reducing the operating current of the laser module. When the time interval satisfies the preset time period, the terminal may control the laser module, such that the operating current of the laser module is reduced compared to the original operating current. For example, it is possible to reduce the number of times the laser module emits laser speckles from 30 times per second to one time per second.

Then, the terminal may control the laser light output of the laser module as follows. The terminal may obtain the depth image acquired by the camera module, calculate the distance value from the object in the image to the camera module according to the depth image, and control the laser light output of the laser module according to the distance value. When the laser lamp in the camera module is turned on, the terminal may collect the speckle image through the laser camera. The terminal receives the image acquisition command sent by the camera module, and the terminal may collect the speckle image through the laser camera according to the received image acquisition command, and the processing unit in the terminal calculates the depth image according to the speckle image. The object in the image refers to a specific object in the depth image. For example, when the depth image acquired by the terminal contains a human face, the object in the image is a real human face. The terminal may calculate the distance value from the object in the depth image to the camera module according to the acquired depth image. The terminal may control the output of the laser module according to the calculated distance value. For example, the terminal may control the operating frequency or operating current of the laser module according to the distance value.

When the distance value is less than or equal to the first preset distance value, the terminal may control the laser module to be turned off, and when the distance value is greater than the first preset distance value and less than or equal to the second preset distance value, the terminal may reduce the operating frequency or operating current of the laser module. When the distance value is less than or equal to the first preset distance value, it indicates that the distance between the object in the image and the camera module is relatively close, and the terminal may control the laser module to be turned off. When the distance value is greater than the first preset distance value and less than or equal to the second preset distance value, it indicates that the distance between the object in the image and the camera module is still relatively close, and the terminal may control the laser light output of the laser module by reducing the operating frequency or operating current of the laser module.

Finally, the terminal may control the laser light output of the laser module as follows. The terminal may acquire the change frequency of the image content in the images acquired by the camera module, and control the laser light output of the laser module according to the change frequency. The change frequency of the image content refers to the change frequency of the motion of the object in the images. For example, when the image content is a human face, the change frequency of the image content is the frequency at which the human face moves in the camera. The terminal may control the laser light output of the laser module according to the change frequency of the image content.

The terminal may compare the change frequency and the preset frequency to obtain a comparison result. When the comparison result indicates that the change frequency is greater than the preset frequency, the terminal may increase the operating frequency of the laser module, and when the comparison result indicates that the change frequency is less than or equal to the preset frequency, the terminal may reduce the operating frequency of the laser module. The preset frequency refers to the preset number of times the object changes its position over a period of time. The terminal may compare the change frequency of the image content in the acquired images with the preset frequency to obtain the comparison result. When the comparison result obtained by the terminal is that the change frequency is greater than the preset frequency, it indicates that the position of the image content in the images changes frequently, and the terminal may control the laser module to increase the operating frequency. When the comparison result obtained by the terminal is that the change frequency is less than or equal to the preset frequency, it indicates that the number of times the position of the image content changes in the image is small, and the terminal may control the laser module to reduce the operating frequency.

It should be understood that although the various steps in the above-described flowcharts are displayed in an order as indicated by the arrows, these steps are not necessarily performed in the order indicated by the arrows. Unless explicitly stated herein, the execution of these steps is not strictly limited, and the steps may be performed in other orders. Moreover, at least some of the steps in the above flow chart may include a plurality of sub-steps or stages, which are not necessarily performed at the same time, but may be executed at different times. These sub-steps or stages are not necessarily performed sequentially, but may be performed alternately with at least a portion of other steps or sub-steps or stages of other steps.

Figure 18:
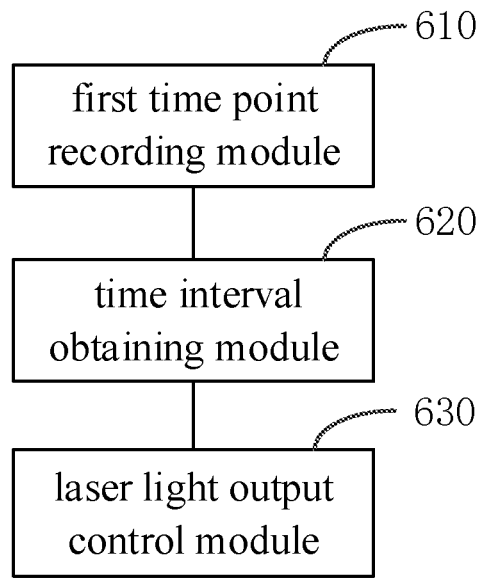
FIG. 18 is a block diagram illustrating a device for controlling a laser light output according to some implementations of the present disclosure.

In an embodiment, as illustrated in FIG. 18, a device for controlling a laser light output is provided. The device includes a first time point recording module 610, a time interval obtaining module 620, and a laser light output control module 630.

The first time point recording module 610 is configured to record a first time point for turning on a laser module in response to detecting that the laser module is turned on.

The time interval obtaining module 620 is configured to obtain a time interval from the first time point to a current operating time point of the laser module.

The laser light output control module 630 is configured to control the laser light output of the laser module when the time interval satisfies a preset time period.

In an embodiment, the laser light output control module 630 may be further configured to reduce an operating frequency of the laser module when the time interval satisfies the preset time period.

In an embodiment, the laser light output control module 630 may be further configured to reduce an operating current of the laser module when the time interval satisfies the preset time period.

In an embodiment, the laser light output control module 630 may be further configured to acquire a depth image captured by a camera module, calculate a distance value from an object in the depth image to the camera module based on the depth image, and control the laser light output of the laser module based on the distance value.

In an embodiment, the laser light output control module 630 may be further configured to control to turn off the laser module when the distance value is less than or equal to a first preset distance value, and reduce an operating frequency or an operating current of the laser module when the distance value is greater than the first preset distance value and less than or equal to a second preset distance value.

In an embodiment, the laser light output control module 630 may be further configured to obtain a change frequency of image content in images captured by the camera module, and control the laser light output of the laser module based on the change frequency.

In an embodiment, the laser light output control module 630 may be further configured to obtain a comparison result by comparing the change frequency and a preset frequency, increase an operating frequency of the laser module when the comparison result indicates that the change frequency is greater than the preset frequency, and reduce the operating frequency of the laser module when the comparison result indicates that the change frequency is less than or equal to the preset frequency.

The division of respective modules in the device for controlling the laser light output is for illustrative purposes only. In other embodiments, the device for controlling the laser light output may be divided into different modules as needed, to perform all or part of the functions of the above-described device for controlling the laser light output.

For specific definitions of the device for controlling the laser light output, reference may be made to the above definition of the method for controlling the laser light output, which will not be elaborated here. Respective modules of the above-described device for controlling the laser light output may be implemented in whole or in part by software, hardware, and the combination thereof. Each of the above modules may be embedded in or independent of the processor in the computer device, or may be stored in a memory in the computer device in a software form, so that the processor invokes them to execute the operations corresponding to the above modules. In one example, the first time point recording module 610 may be the first processing unit 220, the time interval obtaining module 620 may be the first processing unit 220 and/or the security processing unit 240, and the laser light output control module 630 may be the first processing unit 220 and/or the security processing unit 240 and the like.

The implementation of respective modules in the device for controlling the laser light output according to embodiments of the present disclosure may be in the form of computer programs. The computer programs may run on a terminal or a server. The program modules composed of the computer programs may be stored on the memory of the server or terminal. When the computer programs are executed by the processor, the method described in the embodiments of the present disclosure is implemented.

Figure 19:
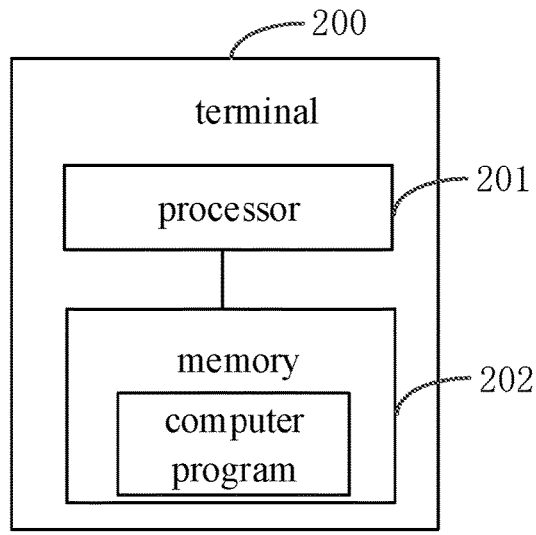
FIG. 19 is a block diagram illustrating a terminal according to some implementations of the present disclosure.

As illustrated in FIG. 19, the terminal 200 according to the embodiments of the present disclosure includes a memory 202 and a processor 201. The computer programs are stored in the memory 202. When the computer programs are executed by the processor 201, the method for controlling the laser light output is implemented by the processor 201. A first time point for turning on a laser module is recorded in response to detecting that the laser module is turned on. A time interval from the first time point to a current operating time point of the laser module is obtained and the laser light output of the laser module is controlled when the time interval satisfies a preset time period.

In an embodiment, controlling the laser light output of the laser module when the time interval satisfies the preset time period includes: reducing an operating frequency of the laser module when the time interval satisfies the preset time period.

In an embodiment, controlling the laser light output of the laser module when the time interval satisfies the preset time period further includes: reducing an operating current of the laser module when the time interval satisfies the preset time period.

In an embodiment, before controlling the output of the laser module, the method further includes: acquiring a depth image captured by a camera module; calculating a distance value from an object in the depth image to the camera module based on the depth image; and controlling the output of the laser module based on the distance value.

In an embodiment, controlling the output of the laser module based on the distance value includes: controlling to turn off the laser module when the distance value is less than or equal to a first preset distance value; and reducing an operating frequency or an operating current of the laser module when the distance value is greater than the first preset distance value and less than or equal to a second preset distance value.

In an embodiment, the method further includes: obtaining a change frequency of image content in images captured by the camera module; and controlling the output of the laser module based on the change frequency.

In an embodiment, controlling the output of the laser module based on the change frequency includes: obtaining a comparison result by comparing the change frequency and a preset frequency; increasing an operating frequency of the laser module when the comparison result indicates that the change frequency is greater than the preset frequency; and reducing the operating frequency of the laser module when the comparison result indicates that the change frequency is less than or equal to the preset frequency.

Embodiments of the present disclosure further provide a computer readable storage medium, for example, one or more non-volatile computer readable storage medium including computer executable instructions. When the computer executable instructions are executed by one or more processor, the method for controlling the laser light output is executed.

Embodiments of the present disclosure further provide a computer readable storage medium. A computer program is stored in the computer readable storage medium. When the computer program is executed by a processor, the processor is caused to implement the method for controlling the laser light output, the method including steps of: recording a first time point for turning on a laser module in response to detecting that the laser module is turned on, obtaining a time interval from the first time point to a current operating time point of the laser module, and controlling the laser light output of the laser module when the time interval satisfies a preset time period.

In an embodiment, controlling the laser light output of the laser module when the time interval satisfies the preset time period includes: reducing an operating frequency of the laser module when the time interval satisfies the preset time period.

In an embodiment, controlling the laser light output of the laser module when the time interval satisfies the preset time period includes: reducing an operating current of the laser module when the time interval satisfies the preset time period.

In an embodiment, before controlling the output of the laser module, the method further includes: acquiring a depth image captured by a camera module; calculating a distance value from an object in the depth image to the camera module, based on the depth image; and controlling the output of the laser module based on the distance value.

In an embodiment, controlling the output of the laser module based on the distance value includes: controlling to turn off the laser module when the distance value is less than or equal to a first preset distance value; and reducing an operating frequency or an operating current of the laser module when the distance value is greater than the first preset distance value and less than or equal to a second preset distance value.

In an embodiment, the method further includes: obtaining a change frequency of image content in images captured by the camera module; and controlling the output of the laser module based on the change frequency.

In an embodiment, controlling the output of the laser module based on the change frequency includes: obtaining a comparison result by comparing the change frequency and a preset frequency; increasing an operating frequency of the laser module when the comparison result indicates that the change frequency is greater than the preset frequency; and reducing the operating frequency of the laser module when the comparison result indicates that the change frequency is less than or equal to the preset frequency.

When a computer program product including instructions is running on a computer, the computer is caused to perform the method for controlling the laser light output described above.

Figure 20:
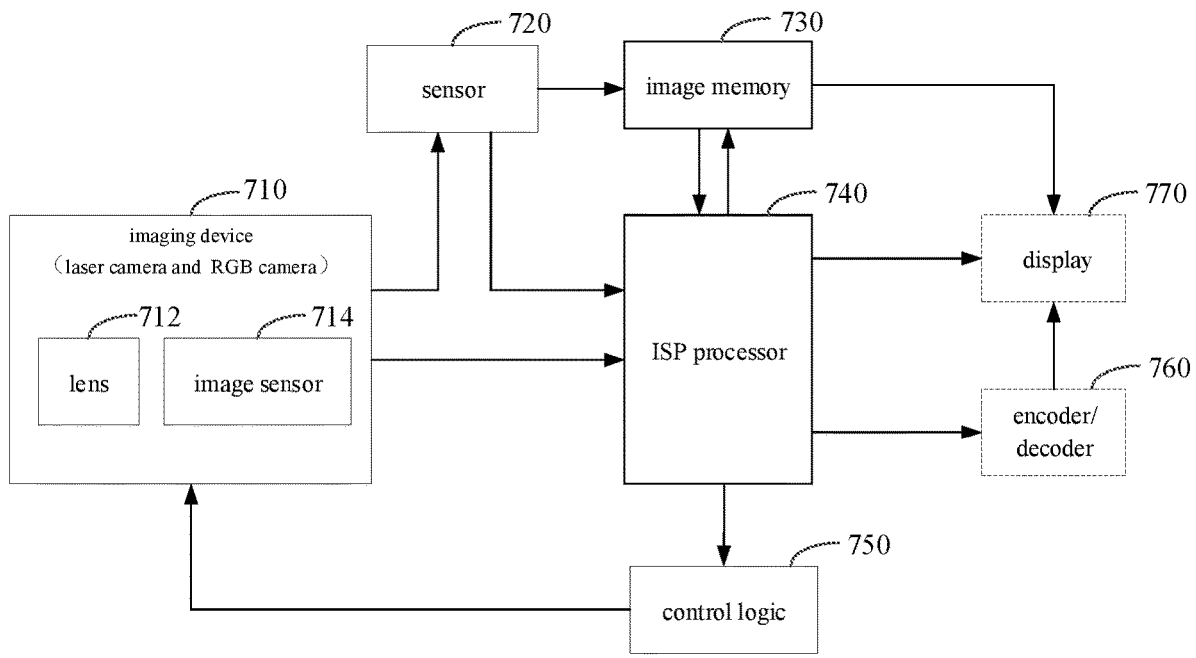
FIG. 20 is a schematic diagram illustrating an image processing circuit according to some implementations of the present disclosure.

Embodiments of the present disclosure further provide a terminal. The above terminal includes an image processing circuit, and the image processing circuit may be implemented by using hardware and/or software components, and may include various processing units defining an Image Signal Processing (ISP) pipeline. FIG. 20 is a schematic diagram illustrating an image processing circuit according to an embodiment of the present disclosure. As illustrated in FIG. 20, for convenience of explanation, only various aspects of the image processing technique related to the embodiments of the present disclosure are illustrated.

As illustrated in FIG. 20, the image processing circuit includes an ISP processor 740 (which may be the aforementioned first processing unit 220 and/or the second processing unit 230) and a control logic 750. Image data captured by an imaging device 710 (which may include the laser camera 212 and the RGB camera 216 described above) is first processed by the ISP processor 740, which analyzes the image data to capture image statistics information for determining one or more control parameters of the imaging device 710. The imaging device 710 may include the laser camera 212 and the RGB camera 216 having one or more lenses 712 and image sensors 714. The image sensor 714 may include a color filter array (such as a Bayer filter). The image sensor 714 may obtain light intensity and wavelength information captured with each of the imaging pixels of the image sensor 714 and provide a set of raw image data that can be processed by the ISP processor 740. The sensor 720, such as a gyroscope, may provide the acquired image processing parameters (such as anti-shake parameters) to the ISP processor 740 based on the type of the interface of the sensor 720. The interface of the sensor 720 may utilize a Standard Mobile Imaging Architecture (SMIA) interface, other serial or parallel camera interface, or the combination thereof.

In addition, the image sensor 714 may transmit the raw image data to the sensor 720, the sensor 720 may provide the raw image data to the ISP processor 740 based on the type of the interface of the sensor 720, or the sensor 720 stores the raw image data to an image memory 730 (may be the random access memory 226 described above).

The ISP processor 740 processes the raw image data pixel by pixel in a variety of formats. For example, each image pixel may have a bit depth of 8, 10, 12, or 14 bits, and the ISP processor 740 may perform one or more image processing operations on the raw image data, to collect statistics information about the image data. The image processing operations may be performed with the same or different bit depth precision.

The ISP processor 740 may also receive image data from the image memory 730. For example, the interface of the sensor 720 transmits raw image data to the image memory 730, the raw image data in the image memory 730 is then sent to the ISP processor 740 for processing. The image memory 730 may be part of a memory device, a storage device, or a separate dedicated memory within a terminal, which may include Direct Memory Access (DMA) features.

When receiving raw image data from the interface of the image sensor 714 or from the interface of the sensor 720 or from the image memory 730, the ISP processor 740 may perform one or more image processing operations, such as time domain filtering. The processed image data may be sent to the image memory 730 for additional processing before being displayed. The ISP processor 740 receives the processed data from the image memory 730 and performs image data processing in the original domain and in the RGB and YCbCr color spaces. The image data processed by the ISP processor 740 may be output to the display 770 for viewing by the user and/or for further processing by a graphics engine or a Graphics Processing Unit (GPU). In additional, the output of the ISP processor 740 may also be sent to the image memory 730, and the display 770 may read image data from the image memory 730. In one embodiment, the image memory 730 may be configured to implement one or more frame buffers. In additional, the output of the ISP processor 740 may be sent to an encoder/decoder 760 to encode/decode image data. The encoded image data may be saved and decompressed before being displayed on the display 770. The encoder/decoder 760 may be implemented by a CPU or GPU or coprocessor.

The statistics data determined by the ISP processor 740 may be sent to the control logic 750. For example, the statistics data may include the statistics information of the image sensor 714, such as auto exposure, auto white balance, auto focus, flicker detection, black level compensation, shading correction of the lens 712, and the like. The control logic 750 may include a processor and/or a microcontroller that executes one or more routines, such as firmware, and the one or more routines may determine control parameters of the ISP processor 740 and the imaging device 710 based on received statistics data. For example, the control parameters of the imaging device 710 may include the control parameters of the sensor 720 (e.g., gain, integration time of exposure control, anti-shake parameters), flash control parameters of the camera, control parameters of the lens 72 (e.g., focus or zoom focal length), or a combination of these parameters. The control parameters of the ISP processor may include gain levels and color correction matrices for automatic white balance and color adjustment (e.g., during RGB processing), and shading correction parameters of the lens 72.

Any reference to the memory, storage, database or other medium used herein may include non-volatile and/or volatile memory. The non-volatile memories may include read only memory (ROM), programmable ROM (PROM), electrically programmable ROM (EPROM), electrically erasable programmable ROM (EEPROM), or flash memory. The volatile memory may include random access memory (RAM), which acts as an external cache. By way of illustration and not limitation, RAM is available in a variety of formats, such as static RAM (SRAM), dynamic RAM (DRAM), synchronous DRAM (SDRAM), double data rate SDRAM (DDR SDRAM), enhanced SDRAM (ESDRAM), sync link DRAM (SLDRAM), rambus direct RAM (RDRAM), direct rambus dynamic RAM (DRDRAM), and rambus dynamic RAM (RDRAM).

In the description of the present disclosure, reference throughout this specification to "an embodiment," "some embodiments," "an example," "a specific example," or "some examples," means that a particular feature, structure, material, or characteristic described in connection with the embodiment or example is included in at least one embodiment or example of the present disclosure. Thus, the appearances of the phrases in various places throughout this specification are not necessarily referring to the same embodiment or example of the present disclosure. Furthermore, the particular features, structures, materials, or characteristics may be combined in any suitable manner in one or more embodiments or examples. Without a contradiction, the different embodiments or examples and the features of the different embodiments or examples can be combined by those skilled in the art.

In addition, terms such as "first" and "second" are used herein for purposes of description and are not intended to indicate or imply relative importance or significance. Furthermore, the feature defined with "first" and "second" may comprise one or more this feature distinctly or implicitly. In the description of the present disclosure, "a plurality of" means two or more than two, unless specified otherwise.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A system for controlling a laser projector, comprising:
a first drive circuit, coupled to the laser projector and configured to output an electrical signal to drive the laser projector to project laser light, and to turn off the laser projector when a duration of outputting the electrical signal is greater than or equal to a preset threshold;
an application processor, coupled to the first drive circuit; and
a watchdog timer, coupled to the application processor and the first drive circuit respectively, and configured to receive a predetermined signal from the application processor and to turn off the first drive circuit when the predetermined signal is not received by the watchdog timer within a preset time period;
wherein the first drive circuit is configured to send a timeout signal to the application processor when the duration is greater than or equal to the preset threshold; and
wherein the application processor is configured to stop sending the predetermined signal to the watchdog timer in response to receiving the timeout signal.

2. The system of claim 1, wherein the first drive circuit is configured to stop outputting the electrical signal when the duration is greater than or equal to the preset threshold.

3. The system of claim 1, further comprising:
a microprocessor, coupled to the first drive circuit, and
a watchdog timer, coupled to the microprocessor and the first drive circuit respectively, and configured to receive a predetermined signal from the microprocessor, and to turn off the first drive circuit when the predetermined signal is not received by the watchdog timer within a preset time period;
wherein the first drive circuit is configured to send a timeout signal to the microprocessor when the duration is greater than or equal to the preset threshold; and
wherein the microprocessor is configured to stop sending the predetermined signal to the watchdog timer in response to receiving the timeout signal.

4. The system of claim 1, further comprising:
a second drive circuit, coupled to the first drive circuit and configured to supply power for the first drive circuit.

5. The system of claim 1, further comprising:
a control circuit, coupled to the first drive circuit and the laser projector respectively, the control circuit comprising a resistance element, a detection element and a switch element, wherein the detection element is coupled in series with the resistance element and the first drive circuit and configured to detect a current flowing through the resistance element, and the switch element is configured to be switched off to turn off the laser projector when the current is greater than a predetermined current value.

6. The system of claim 1, wherein the watchdog timer is further configured to send a reset signal for restarting the application processor when the predetermined signal is not received within the preset time period.

7. A laser projector assembly, comprising:
a laser projector;
a first drive circuit, coupled to the laser projector, and configured to output an electrical signal to drive the laser projector to project laser light, and to turn off the laser projector when a duration of outputting the electrical signal is greater than or equal to a preset threshold;
an application processor, coupled to the first drive circuit, and
a watchdog timer, coupled to the application processor and the first drive circuit respectively, and configured to receive a predetermined signal from the application processor and to turn off the first drive circuit when the predetermined signal is not received by the watchdog timer within a preset time period;
wherein the first drive circuit is configured to send a timeout signal to the application processor when the duration is greater than or equal to the preset threshold; and
wherein the application processor is configured to stop sending the predetermined signal to the watchdog timer in response to receiving the timeout signal.

8. The laser projector assembly of claim 7, wherein the first drive circuit is configured to stop outputting the electrical signal when the duration is greater than or equal to the preset threshold.

9. The laser projector assembly of claim 7, further comprising:
a second drive circuit, coupled to the first drive circuit and configured to supply power for the first drive circuit.

10. The laser projector assembly of claim 7, further comprising:
a control circuit, coupled to the first drive circuit and the laser projector respectively, the control circuit comprising a resistance element, a detection element and a switch element, wherein the detection element is configured to detect a current flowing through the resistance element, and the switch element is configured to be switched off to turn off the laser projector when the current is greater than a predetermined current value.

11. A method for controlling a laser projector, the laser projector being coupled to a first drive circuit, and the method comprising:
outputting, by the first drive circuit, an electrical signal to drive the laser projector to project laser light;
turning off the laser projector when a duration of outputting the electrical signal is greater than or equal to a preset threshold;
receiving a predetermined signal from an application processor;
turning off the first drive circuit when the predetermined signal is not received within a preset time period;
sending, by the first drive circuit, a timeout signal to the application processor when the duration is greater than or equal to the preset threshold; and
stopping sending, by the application processor, the predetermined signal to a watchdog timer when the timeout signal is received by the application processor.

12. The method of claim 11, wherein turning off the laser projector when the duration of outputting the electrical signal is greater than or equal to the preset threshold comprises:
stopping outputting the electrical signal when the duration is greater than or equal to the preset threshold.

13. The method of claim 11, further comprising:
receiving a predetermined signal from a microprocessor;
turning off the first drive circuit when the predetermined signal is not received within a preset time period;
sending, by the first drive circuit, a timeout signal to the microprocessor when the duration is greater than or equal to the preset threshold; and
stopping sending, by the microprocessor, the predetermined signal to a watchdog timer when the timeout signal is received by the microprocessor.

14. The method of claim 11, further comprising:
detecting a current flowing through the first drive circuit; and
controlling to turn off the laser projector when the current is greater than a predetermined current value.

15. The method of claim 11, further comprising:
sending a reset signal for restarting the application processor when the predetermined signal is not received within the preset time period.

* * * * *